United States Patent
VanHarlingen et al.

(10) Patent No.: US 8,909,154 B2
(45) Date of Patent: *Dec. 9, 2014

(54) METHOD AND SYSTEM FOR SELECTING, TRANSMITTING, AND RECEIVING AN UNUSED CARRIER FREQUENCY AND TRANSMITTING OVER THE UNUSED CARRIER FREQUENCY

(71) Applicant: Belkin International, Inc., Playa Vista, CA (US)

(72) Inventors: Brian VanHarlingen, Torrance, CA (US); Michael Tad LeDuc, Rochester, NY (US); Shane Igo, Artesia, CA (US); Richard James Elgie, Irvine, CA (US); David Kleeman, Marina Del Rey, CA (US); Jason Tu, Irvine, CA (US); Vannin Gale, Anaheim Hills, CA (US); Timothy Brewer, San Diego, CA (US); Oliver Duncan Seil, Pasadena, CA (US); Kent Iverson, Redondo Beach, CA (US); Chad Singer, Santa Monica, CA (US)

(73) Assignee: Belkin International, Inc., Playa Vista, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/960,718

(22) Filed: Aug. 6, 2013

(65) Prior Publication Data

US 2014/0038626 A1 Feb. 6, 2014

Related U.S. Application Data

(63) Continuation of application No. 12/611,036, filed on Nov. 2, 2009, now Pat. No. 8,503,937, and a (Continued)

(51) Int. Cl.
*H04B 15/00* (2006.01)
*H04B 17/00* (2006.01)

(Continued)

(52) U.S. Cl.
CPC ......... *H04W 72/0453* (2013.01); *H03J 1/0091* (2013.01); *H04B 1/3822* (2013.01); *H04B 7/26* (2013.01); *H03J 1/0066* (2013.01); *H04W 64/006* (2013.01)
USPC ........................................ 455/62; 455/456.1

(58) Field of Classification Search
CPC ........................... H04W 72/0453; H03J 1/0091
USPC ......... 455/62, 67.7, 103, 414.1, 414.2, 456.1, 455/456.3, 456.5, 456.6, 71, 75, 313, 3.02
See application file for complete search history.

(56) References Cited

U.S. PATENT DOCUMENTS

| 4,969,209 A | 11/1990 | Schwob |
| 5,884,181 A | 3/1999 | Arnold et al. |

(Continued)

FOREIGN PATENT DOCUMENTS

| EP | 2019493 | 1/2009 |
| WO | 9844663 | 10/1998 |

(Continued)

OTHER PUBLICATIONS

Nine Vie to Manage White Space Database, http://www.televisionbroadcast.com/PrintableView.aspx?contentid=106970, 2 pages. Jan. 24, 2011.

(Continued)

*Primary Examiner* — Eugene Yun
(74) *Attorney, Agent, or Firm* — Bryan Cave LLP

(57) ABSTRACT

Some embodiments concern a method of transmitting electrical signals. The method can include: using a global positioning satellite receiver to determine a first location of a first electrical device; using a first transmitter to transmit the first location to a first server; using a receiver to receive information identifying at least one first unused frequency at the first location from the first server; selecting a first transmission frequency from the at least one first unused frequency; and communicating the first transmission frequency to a user. Other embodiments are disclosed in this application.

20 Claims, 11 Drawing Sheets

Related U.S. Application Data continuation-in-part of application No. 12/171,202, filed on Jul. 10, 2008, now Pat. No. 8,509,695.

(60) Provisional application No. 61/176,097, filed on May 6, 2009, provisional application No. 60/959,092, filed on Jul. 10, 2007.

(51) Int. Cl.
| | |
|---|---|
| *H04W 72/04* | (2009.01) |
| *H03J 1/00* | (2006.01) |
| *H04B 1/38* | (2006.01) |
| *H04B 7/26* | (2006.01) |
| *H04W 64/00* | (2009.01) |

(56) References Cited

U.S. PATENT DOCUMENTS

| | | | |
|---|---|---|---|
| 5,970,390 | A | 10/1999 | Koga et al. |
| 6,052,603 | A | 4/2000 | Kinzalow et al. |
| 6,075,999 | A | 6/2000 | Vilmi et al. |
| 6,181,921 | B1 | 1/2001 | Konisi et al. |
| 6,539,212 | B1 | 3/2003 | Kamalski |
| 6,728,375 | B1 | 4/2004 | Palett et al. |
| 6,782,239 | B2 | 8/2004 | Johnson et al. |
| 6,925,114 | B2 | 8/2005 | Altizer et al. |
| 6,926,114 | B2 | 8/2005 | Bolourch et al. |
| 7,650,118 | B2 | 1/2010 | Hsieh et al. |
| 7,680,459 | B2 | 3/2010 | Faltman et al. |
| 7,801,497 | B1 | 9/2010 | Lam |
| 8,503,937 | B2 * | 8/2013 | VanHarlingen et al. ........ 455/62 |
| 2002/0029091 | A1 | 3/2002 | Seno et al. |
| 2003/0013425 | A1 | 1/2003 | Nee |
| 2003/0036357 | A1 | 2/2003 | McGowan |
| 2003/0040272 | A1 | 2/2003 | Lelievre et al. |
| 2003/0060219 | A1 | 3/2003 | Parsiokas |
| 2003/0182058 | A1 | 9/2003 | Chen et al. |
| 2005/0215285 | A1 | 9/2005 | Lin |
| 2006/0099962 | A1 | 5/2006 | Lee |
| 2007/0010222 | A1 | 1/2007 | van Hoff et al. |
| 2007/0030841 | A1 | 2/2007 | Lee et al. |
| 2007/0117580 | A1 | 5/2007 | Fehr |
| 2007/0142010 | A1 | 6/2007 | Christopher |
| 2007/0211692 | A1 | 9/2007 | Boroski et al. |
| 2007/0211830 | A1 | 9/2007 | Elenes et al. |
| 2009/0163225 | A1 | 6/2009 | Haghighi et al. |
| 2009/0311984 | A1 | 12/2009 | Khushu et al. |

FOREIGN PATENT DOCUMENTS

| | | |
|---|---|---|
| WO | 0052984 | 9/2000 |
| WO | 2004008649 | 1/2004 |
| WO | 2006134351 | 12/2006 |
| WO | 2007076183 | 7/2007 |
| WO | 2008062249 | 5/2008 |

OTHER PUBLICATIONS

FCC takes "free love" approach to white spaces spectrum, http://www.networkworld.com/cgi-bin/mailto/x.cgi?pagetosend=/news/2010092710-fcc-..., 2 pages. Jan. 24, 2011.

International Search Report, Application No. PCT/US2010/033622, 11 pages, Jul. 16, 2010.

Basic Compression Terms, Alesis Tech Notes, Oct. 16, 1996, pp. 1-3.

European Search Report; Application No. 08252348. 1-2411/02019493; Mar. 10, 2009; 10 pages.

* cited by examiner

METHOD AND SYSTEM FOR SELECTING, TRANSMITTING, AND RECEIVING AN UNUSED CARRIER FREQUENCY AND TRANSMITTING OVER THE UNUSED CARRIER FREQUENCY

CROSS-REFERENCE TO RELATED APPLICATIONS

This application is a continuation of U.S. patent application Ser. No. 12/611,036, filed Nov. 2, 2009, which claims the benefit of U.S. Provisional Application No. 61/176,097, filed May 6, 2009. This application is also a continuation-in-parts of U.S. patent application Ser. No. 12/171,202, filed Jul. 10, 2008, which claims priority from U.S. Provisional Patent Application No. 60/959,092, filed Jul. 10, 2007. U.S. Provisional Application Nos. 61/176,097 and 60/959,092 and U.S. patent application Ser. Nos. 12/171,202 and 12/611,036 are incorporated herein by reference.

FIELD OF THE INVENTION

This invention relates generally to methods and systems for broadcasting an electrical signal, and relates more particularly to methods and systems for selecting, transmitting, and receiving an unused carrier frequency and broadcasting electrical signals over the unused carrier frequency.

DESCRIPTION OF THE BACKGROUND

With the increasing popularity of portable media players, people want to listen to music or other media stored in a portable media player while driving in a vehicle. Moreover, they also want to listen to the music or other media through the vehicle's radio and speaker system. A vehicle's radio and speaker system, however, do not connect easily to a portable media player. In vehicles with a cassette player, a person can hardwire the portable media player to the cassette player in the vehicle using a bulky input connector.

Unfortunately, in a vehicle that does not have a cassette player, people have to find other ways of sending the music or other media from the portable media player to the vehicle's radio or speaker system. One method involves coupling the portable media player to a wireless transmitter, which transmits the music or other media to the vehicle's radio and speaker system over a RF (radio frequency) carrier frequency.

While using a transmitter solves the problem of coupling the portable media player to the vehicle's radio and speaker system, it creates new problems and hazards for the driver of the vehicle. For example, a driver must find an unused radio frequency (RF) carrier frequency to transmit the electrical signals for the music or other media, and finding the unused frequency can be difficult and distracting to the driver. Additionally, the unused RF carrier frequencies are constantly changing as the vehicle moves in and out of range of radio stations. Another potential problem is that tall buildings, hills, and other large structures can temporarily block signals on an RF carrier frequency and make a used carrier frequency appear to be unused. These factors can make finding an unused RF carrier frequency frustrating and potentially dangerous if a driver becomes inattentive to the road while trying to locate an unused RF carrier frequency.

Accordingly, a need exists for an apparatus or system that allows a person to easily find unused frequencies on which electrical information can be wirelessly transmitted.

BRIEF DESCRIPTION OF THE DRAWINGS

To facilitate further description of the embodiments, the following drawings are provided in which.

Figure 1:
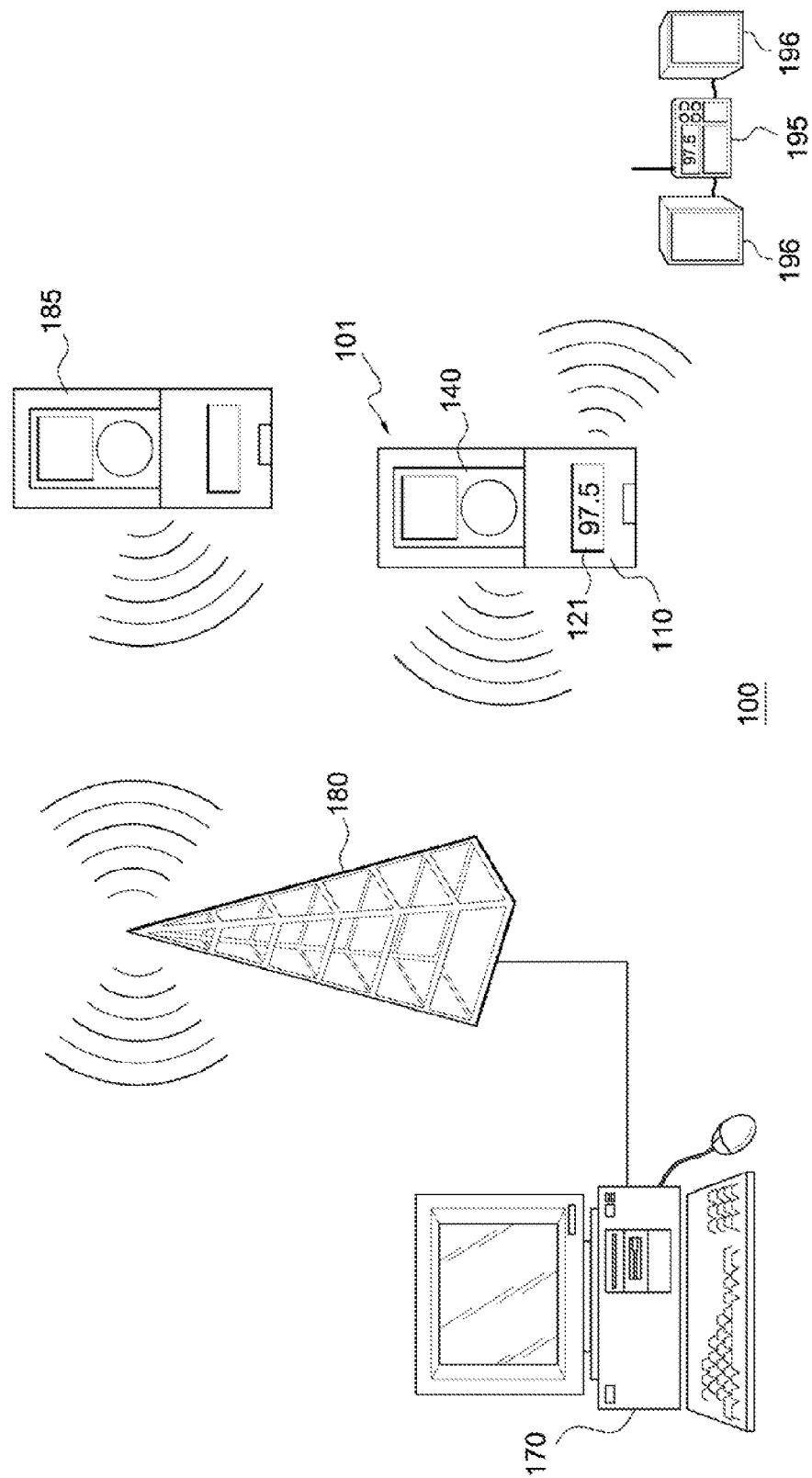
FIG. 1 illustrates an overview of a system for transmitting electrical signals over an unused radio frequency in a set of carrier frequencies, according to a first embodiment.

For simplicity and clarity of illustration, the drawing figures illustrate the general manner of construction, and descriptions and details of well-known features and techniques may be omitted to avoid unnecessarily obscuring embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically and/or otherwise. Two or more electrical elements may be electrically coupled but not be mechanically or otherwise coupled; two or more mechanical elements may be mechanically coupled, but not be electrically or otherwise coupled; two or more electrical elements may be mechanically coupled, but not be electrically or otherwise coupled. Coupling may be for any length of time, e.g., permanent or semi-permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types.

The absence of the word "removably," "removable," and the like near the word "coupled," and the like does not mean that the coupling, etc. in question is or is not removable. For example, the recitation of electrical device 140 coupled to electrical device 110 does not mean that the electrical device 140 cannot be removed (readily or otherwise) from, or that it is permanently connected to, the electrical device 110.

DETAILED DESCRIPTION OF EXAMPLES OF EMBODIMENTS

Some embodiments concern a method of transmitting electrical signals. The method can include: using a global positioning satellite receiver to determine a first location of a first electrical device; using a first transmitter to transmit the first location to a first server; using a receiver to receive information identifying at least one first unused frequency at the first location from the first server; selecting a first transmission frequency from the at least one first unused frequency; and communicating the first transmission frequency to a user.

Other embodiments concern a method of determining one or more useable radio frequencies in two or more first geographic areas. The two or more first geographic areas can include a second geographic area and a third geographic area. The method can include: receiving first usability information for one or more radio frequencies in the second geographic area from two or more first electrical devices; storing the first usability information; analyzing the first usability information to identify at least one first unused frequency in the third geographic area; and providing information identifying the at least one first unused frequency to one or more second electrical devices. The one or more useable frequencies can include the at least one first unused frequency. The first usability information can include at least one of signal strength information or user rating information.

Still other embodiments concern another method of transmitting electrical signals. The method can include: synchronizing a first list of useable radio frequencies in a database with a second list of useable radio frequencies on a first server; using a global positioning satellite receiver to determine a first location of a first electrical device; determining at least one first unused frequency at the first location by querying the database; selecting a first transmission frequency from at least the at least one first unused frequency; and communicating the first transmission frequency to a user.

In the same or different embodiments, an electrical device can include: a global positioning satellite receiver configured to determine a location of the electrical device; a receiver configured to receive information regarding at least one unused frequency; a first transmitter configured to transmit information regarding the location of the electrical device; a selection module electrically coupled to the receiver and the first transmitter; and a display configure to display information regarding a first transmission frequency to a user of the electrical device. The selection module can be configured to select the first transmission frequency from the at least one unused frequency.

Turning to the drawings, FIG. 1 illustrates an overview of a system 100 for transmitting electrical signals over an unused radio frequency in a set of carrier frequencies, according to a first embodiment.

Broadly speaking, and as explained in detail below, in some embodiments, portable system 101 in system 100 can determine its location (e.g., using a global position system (GPS) receiver 344 (FIG. 3)). System 101 then can transmit its location to a computer or server 170 via transmission device 180. Server 170 can determine at least one unused frequency at a location provided by system 101. Server 170 can transmit information identifying the at least one unused frequencies (i.e., "identifying information") to system 101. System 101 can receive the identifying information and can select a transmission frequency from the at least one unused radio frequency. System 101 wirelessly broadcasts electrical signals over the transmission frequency while also communicating the transmission frequency to a user (e.g., displaying the transmission frequency on a display 121). The user can then tune a receiving device 195 to the transmission frequency to receive the electrical signals. In some examples, the electrical signals can be audio signals, and receiving device 195 can play or broadcast the audio through speakers 196. In one embodiment, receiving device 195, speakers 196, and system 101 are in and/or part of a moving vehicle.

In the same of different embodiment, system 101 can also be configured to determine the signal strength information for one or more radio frequencies at the location of system 101 (as determined by GPS receiver 344 (FIG. 3)). After determining the signal strengths, system 101 can communicate the signal strength(s) to server 170 via transmission device 180 or, in some embodiments, wirelessly broadcast electrical signals over the transmission frequency while also communicating the transmission frequency to a user via display 121. Server 170 can combine the signal strength information with signal strength data received from other systems (e.g., system 185 when system 185 was at the general current location of system 101) and analyze the signal strength information to identify at least one first unused frequency at the current location of system 101. Server 170 can provide this information identifying the at least one first unused frequency to one or more second electrical devices or portable systems when such one or more second electrical devices or portable systems request an unused frequency at the general location of system 101.

System 100 provides an automated system for the user of electrical device 110 to select an unused frequency for transmitting electrical signals. In other methods of selecting a transmission frequency, nearby geographic features (e.g., hills or a tall building) can hamper identifying unused frequencies. However, system 100 can automatically identify unused frequencies without the frustration or annoyance of false unused frequencies.

System 100 is also an improvement over existing methods of selecting a transmission frequency because the transmission frequency is selected based on the user location as determined by a global positioning system. Other systems do not have the ability to provide unused frequencies correlated to the location of the user and particularly correlated to the automated location identification of the user. These other systems will provide, for example, one unused frequency for all of the Los Angeles metropolitan area, even though better unused frequencies may exist at the user's specific location in Los Angeles metropolitan area. As will be described below, system 100 can use multiple real-time and/or dynamic sources for its data about unused frequencies at a location. Existing systems rely on a single static source of data about unused frequency.

System 100 can be considered a system configured to select a transmission frequency from a set of frequencies or a system for transmitting one or more electrical signals. System 100 can also be considered a system configured to identify at least one unused frequency in a set of frequencies. That is, system 100 can be a system for selecting a transmission frequency used to transmit an electrical signal from system 101 to receiving device 195. System 100 is merely exemplary and is not limited to the specific embodiments or examples presented herein. System 100 can be employed in many different embodiments or examples not specifically depicted or described herein.

Referring to FIG. 1, system 100 can include: (a) a portable system 101; (b) a transmission device 180; (c) a server 170 coupled to transmission device 180; and (c) a receiving device 195. In various embodiments, one or more other systems 185 can also communicate with server 170 through transmission device 180. In the same or different embodiments, systems 185 can be similar or identical to system 101.

In some examples, system 101 can include: (a) an electrical device 110; and (b) an electrical device 140 coupled to electrical device 110. In other examples, electrical device 110 and electrical device 140 can be a single electrical device or can be divided into three or more electrical devices.

Receiving device 195 can be any electrical device that includes a receiver configured to receive radio frequency (or other high frequency) signals. In some embodiments, receiving device 195 can be a radio or more specifically, a car radio.

In some examples, the set of carrier frequencies can include the full FM band. In the United States, the FM band includes the frequencies or channels between 88.1 MHz (megahertz) and 107.9 MHz. In Japan, the FM band includes frequencies between 76 MHz and 90 MHz. In Europe and other parts of Asia, the FM band includes frequencies between 87.6 MHz and 107.9 MHz.

In the US, there is a 200 KHz (kilohertz) spacing between adjacent FM bands or adjacent carrier frequencies. That is, the set of carrier frequencies include the FM bands separated by a 0.2 MHz spacing (i.e., 88.1 MHz, 88.3 MHz, 88.5 MHz, etc.). In Japan and Europe, the spacing between adjacent FM bands or adjacent carrier frequencies is 0.1 MHz. In other embodiments, the set of carrier frequencies includes a subset of the full FM band. In further embodiments, the set of carrier frequencies include other carrier frequency sets or bands (e.g., the AM, the VHF (very high frequency), or the UHF (ultra high frequency) band).

Transmission device 180 can be a system for transmitting electrical signals. In many examples, transmission device 180 can wirelessly transmit the electrical signals. In one example, transmission device 180 can include a cellular or mobile phone network. In this example, system 101 can transmit its location to server 170 through the cellular network.

In another example, transmission device 180 can include a router, wireless access point, or other network connectivity device. In this example, system 101 can transmit its location to server 170 though a computer network. In some examples, the computer network can be a distributed information exchange network, such as public and private computer networks (e.g., the Internet, intranets, WAN (wide area network), LAN (local area network), etc.), communications networks (e.g., wired or wireless networks), broadcast networks, and a homogeneous or heterogeneous combination of such networks.

In still another embodiment, transmission device 180 can include a combination of a cellular network and a computer network. In some examples, system 101 can include wireless Internet access. System 101 can access the Internet through a cellular telephone built into system 101 (e.g., system 101 includes data connectivity). That is, system 101 transmits its location over the cellular network to a base station of the cellular network. The location is transmitted from the base station of the cellular network to server 170 through the Internet or other computer network. In further embodiments, other wired or wireless networks (e.g., paging networks, etc.) can be used by system 101 to transmit its location to server 170.

Figure 2:
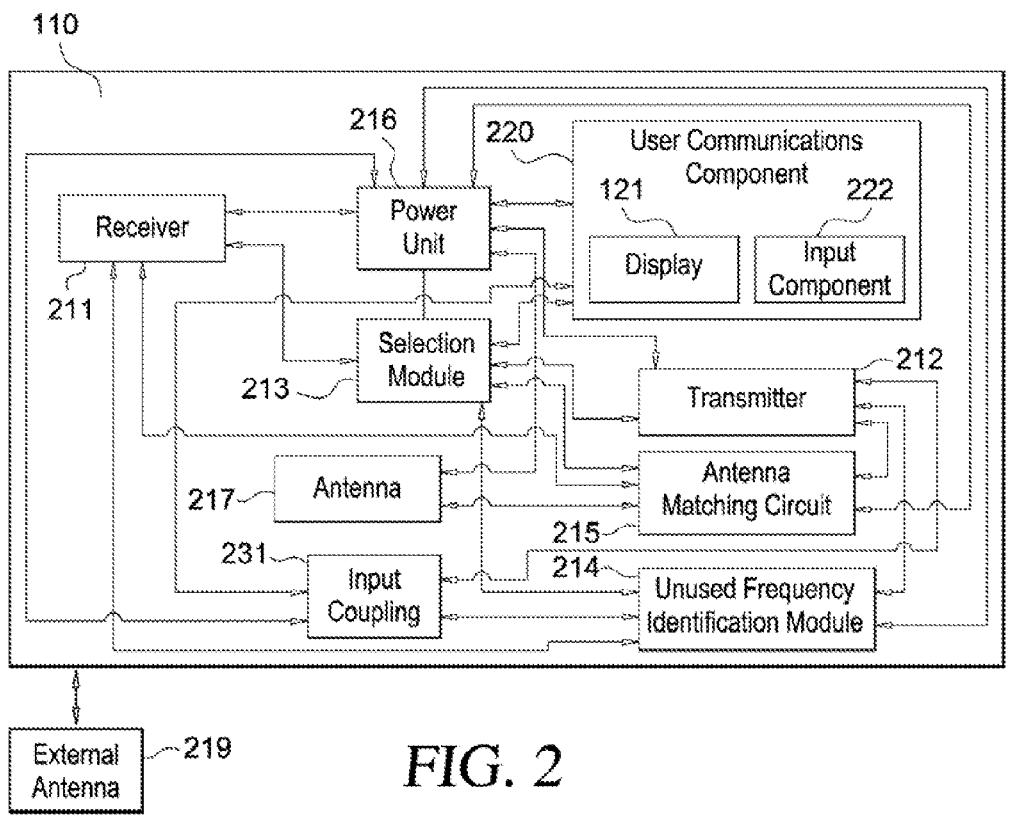
FIG. 2 is a block diagram illustrating an example of an electrical device of the system of FIG. 1, according to the first embodiment.

FIG. 2 is a block diagram illustrating an example of electrical device 110, according to the first embodiment. Electrical device 110 is merely exemplary and is not limited to the specific embodiments or examples presented herein. Electrical device 110 can be employed in many different embodiments or examples not specifically depicted or described herein.

As an example, electrical device 110 can include: (a) at least one receiver 211; (b) at least one transmitter 212; (c) a selection module 213 electrically coupled to receiver 211 and transmitter 212; (d) an unused frequency identification module 214; (e) a user communications component 220; (e) a power unit 216; (f) at least one antenna 217; (g) an antenna matching circuit; and (h) a source input module or input coupling 231. In some examples, among other combinations, the functions of receiver 211 and transmitter 212 can be performed by a single chip or component.

Selection module 213 can be configured to select the transmission frequency from at least one unused frequency. The information about the at least one unused frequency is transmitted to electrical device 110 from server 170 (FIG. 1). In some examples, selection module 213 can also automatically tune transmitter 212 to the transmission frequency.

Input coupling 231 can be configured to couple to electrical device 140 (FIG. 1). In the same or different embodiments, input coupling 231 can transfer communication, power, and audio signals between electrical device 110 and electrical device 140 (FIG. 1). The type of input coupling 231 depends on the type of connector source(s) that electrical device 140 is designed to accept. For example, input coupling 231 can include a thirty-pin male serial connector configured to be plugged into and electrically coupled to an Apple® iPhone® device. In another example, electrical device 140 (FIG. 1) has a female USB (universal serial port) connector for coupling with external devices. In this example, input coupling 231 can be a male USB connector.

Transmitter 212 can be configured to transmit data over the at least one unused frequency (i.e., the transmission frequency) using antenna 217. In some examples, receiver 211 can be configured to receive identifying information about the at least one unused carrier frequency using antenna 217. In other examples, electrical device 140 (FIG. 1) can receive identifying information about the at least one unused carrier frequency. Transmitter 212 and receiver 211 can be coupled to antenna 217 through antenna matching circuit 215.

To comply with FCC (Federal Communications Commission) requirements, the output of transmitter 212 (an electrical signal) can be coupled to an attenuation circuit (not shown). The amount of attenuation that is needed to comply with FCC requirements is dictated by the output of the particular transmitter, the quality, and type of antenna that is being utilized, and the environment in which the transmitter is being used. Consequently, the specific design of the attenuation circuit is a matter of design choice depending upon the needs of the particular application. For some types of electrical signals to be broadcast by transmitter 212, an attenuation circuit will not be needed. In some embodiments, the attenuation circuit can be a portion of antenna matching circuit 215.

In some embodiments, electrical device 110 can be coupled to an external antenna 219 through antenna matching circuit 215 in addition to or instead of antenna 217. Electrical device 110 can send and/or receive electrical signals using external antenna 219.

In the same or different examples, user communications component 220 can include display 121 (e.g., indicator lights or a liquid crystal display (LCD)) and an input component 222. Display 121 can be coupled to selection module 213 and configured to visually display the transmission frequency before and while transmitter 212 is transmitting electrical signals over the transmission frequency.

Input component 222 can be configured to allow a user to select a new unused frequency. Input component 222 should be broadly understood to refer to any type of mechanism (with or without moving parts) with which the user can input to electrical device 110 his or her data (for example, selection of a new carrier frequency). For example, input component 222 can be a mechanical pushbutton, an electrostatic pushbutton, an electrostatic array, a voice activated device, or any other input device of any type.

In some embodiments, input component 222 can include one or more mechanisms that allow a user to rate a transmission frequency. For example, input component 222 can include a "thumbs-up" and a "thumbs-down" to rate positively or negatively the transmission frequency, respectively. In the same or different example, electrical device 110 or 140 can include one or more virtual buttons on display 121 or 351 (FIG. 3), respectively, to rate the transmission frequency.

Unused frequency identification module 214 can be configured to identify one or more unused frequencies. In some examples, unused frequency identification module 214 can use receiver 211 to scan the set of carrier frequencies and measure the signal strength at each carrier frequency. In various embodiments, carrier frequencies with a signal strength below a predetermined value can be added to a list of unused carrier frequencies. In some examples, signal strength can refer to the strength of the signal or to the received noise level. In some examples, what signal strength refers to depends on the transceiver chip in use. The actual value kept in the server (with unused frequencies) would be the same unit (in measurement) no matter what method is used. In the same or different example, unused frequency identification module 214 can select the one or more first unused frequencies at least partially based on characteristics of the one or more carrier frequencies adjacent to each potential unused frequency. In other examples, unused frequency identification module can identify one or more unused frequencies using the method described in U.S. patent application Ser. No. 12/171,202, filed Jul. 10, 2008. In the same or different example, unused frequency identification module 214 can at least partially use user ratings to determine the unused frequencies.

Selection module 213 can be configured to select the transmission frequency from at least one unused carrier frequency and, in some examples, automatically tune transmitter 212 to the transmission frequency. That is, when a user selects the new transmission frequency using input component 222, selection module 213 is configured to select a transmission frequency from the at least one unused frequency and automatically tune transmitter 212 to this new transmission frequency. In some embodiments, selection module 213 and unused frequency identification module 214 can be implemented in one or more of a microprocessor, a microcontroller, or other electronic circuitry. In various examples, selection module 213 and unused frequency identification module 214 can include or be coupled to a memory (e.g., Flash or RAM (random access memory)). In some examples, the memory can store the list of the unused frequencies.

Figure 3:
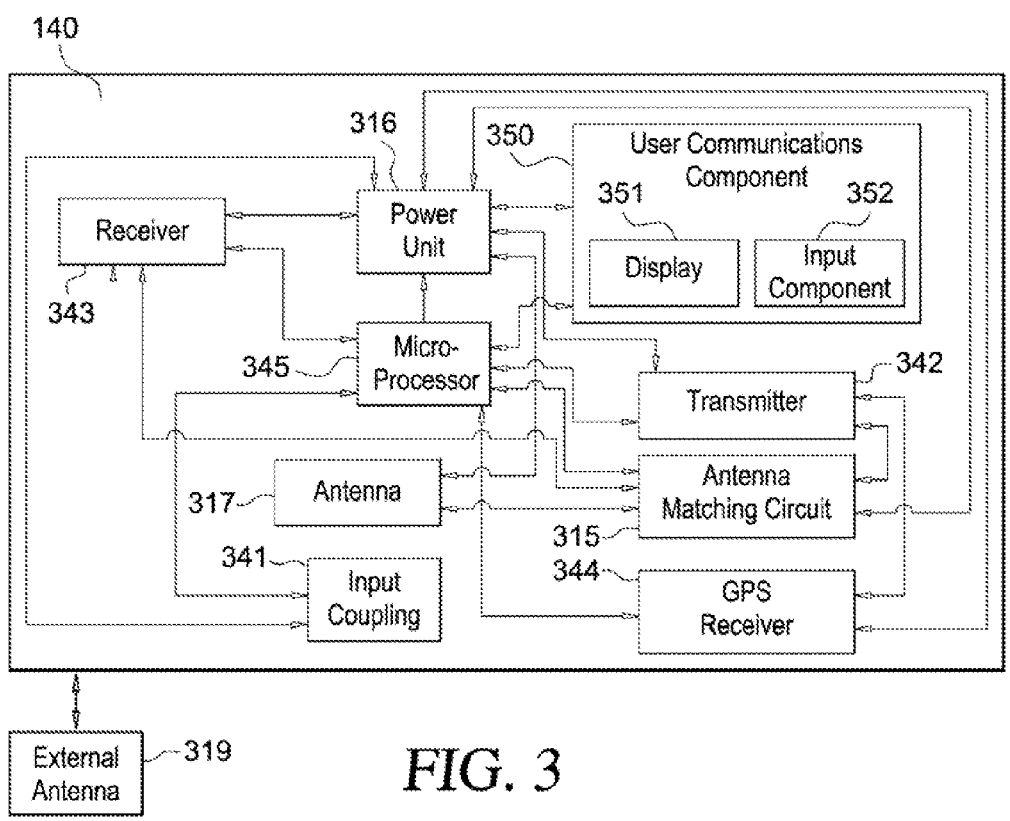
FIG. 3 is a block diagram illustrating an example of another electrical device of the system of FIG. 1, according to the first embodiment.

FIG. 3 is a block diagram illustrating an example of electrical device 140, according to the first embodiment. Electrical device 140 is merely exemplary and is not limited to the specific embodiments or examples presented herein. Electrical device 140 can be employed in many different embodiments or examples not specifically depicted or described herein.

In some embodiments, electrical device 140 is an electrical device configured to produce and receive electrical signals. For example, electrical device 140 can be a cellular (or mobile) phone, a laptop computer, an audio playback device, a portable AM (amplitude modulated) and FM (frequency modulated) radio, a satellite radio, a portable CD (compact disk) player, a data storage device, an audio player, an audio-visual player, and/or a portable media (e.g., MP3) player. The term "electrical device 140" includes electrical devices of all types and designs, including, but not limited to, any of the types of devices described above and/or any combination thereof. For example, electrical device 140 could be an iPhone® or iTouch® device, manufactured by Apple Computers, Inc. of Cupertino, Calif. The iPhone® device can include an MP3 player, an audio visual player, a GPS receiver, a network adapter, and a cellular telephone. The iTouch® device can include an MP3 player, an audio visual player, a GPS receiver, and a network adapter.

As an example, electrical device 140 can include: (a) at least one receiver 343; (b) at least one transmitter 342; (c) a microcontroller or microprocessor 345; (d) a GPS receiver 344; (e) a user communications component 350; (e) a power unit 316; (f) an antenna matching circuit 315; (g) at least one antenna 317; and (h) an input coupling 341. In some examples, among other combinations, the functions of receiver 343 and transmitter 342 can be performed by a single chip or component.

Input coupling 341 can be configured to couple to electrical device 110 (FIGS. 1 and 2). In the same or different embodiments, input coupling 341 can transfer communication, power, and audio signals between electrical device 140 and electrical device 110 (FIG. 1). In one example, input coupling 341 can include a thirty-pin female serial connector. In another example, input coupling 341 can be a female USB connector.

Transmitter 342 can be configured to transmit data (e.g., the location of system 101) to transmission device 180 (FIG.

1) using antenna 317. In some examples, transmitter 342 can be a cellular telephone transmitter. In other examples, transmitter 342 can be configured to transmitter data over a computer network. In this example, transmitter 342 can be part of a wireless modem or network access card ("NIC").

In some examples, receiver 343 can be configured to receive data (e.g., the at least one unused frequency) from transmission device 180 (FIG. 1) using antenna 317. In some examples, receiver 343 can be a cellular telephone receiver. In other examples, receiver 343 can be configured to receive data over a computer network. In this example, receiver 343 can be part of a wireless modem or NIC. Transmitter 342 and receiver 343 can be coupled to antenna 317 through antenna matching circuit 315.

In some embodiments, electrical device 140 can be coupled to an external antenna 319 through antenna matching circuit 315 in addition to or instead of antenna 317. Electrical device 140 can send and/or receive electrical signals using external antenna 319.

In the same or different examples, user communications component 350 can include display 351 (e.g., indicator lights, a liquid crystal display (LCD), and/or a touch screen) and an input component 352.

Input component 352 can be configured to allow a user to input data into electrical device 140. For example, a user can input data related to the selection of an unused frequency or a destination of a trip. Input component 352 should be broadly understood to refer to any type of mechanism (with or without moving parts) with which the user can input to electrical device 140 his or her data. For example, input component 352 can be a mechanical pushbutton, an electrostatic pushbutton, an electrostatic array, a voice activated device, touch screen, or any other input device of any type.

GPS receiver 344 can be configured to determine the location of electrical device 140. In some examples, GPS receiver 344 can receive electrical signals from GPS satellites and use these electrical signals to calculate the location of electrical device 140.

In some embodiments, portions of user communications component 350, transmitter 342, receiver 343, GPS receiver 344, and user communications component 350 can include or be controlled by a microprocessor 345.

Figure 4:
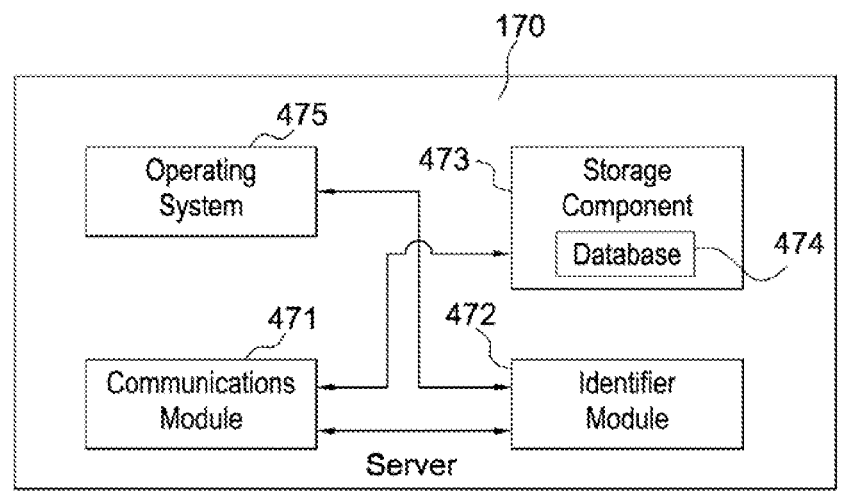
FIG. 4 is a block diagram illustrating a server of the system of FIG. 1, according to the first embodiment.

FIG. 4 is a block diagram illustrating server 170, according to the first embodiment. Server 170 is merely exemplary and is not limited to the specific embodiments or examples presented herein. Server 170 can be employed in many different embodiments or examples not specifically depicted or described herein.

In some examples, server 170 can include: (a) a storage component 473; (b) an identifier module 472; (c) a communications module 471; and (d) an operating system 475.

"Server," as used herein, can refer to a single server or a cluster or collection of servers. Typically, a cluster or collection of servers can be used when the demands by clients (e.g., systems 101 and 185) are beyond the reasonable capability of a single server. In many embodiments, the servers in the cluster or collection of servers are interchangeable from the perspective of clients.

In some examples, a single server can include all of the modules of server 170. In other examples, a first server can include a first portion of storage component 473, identifier module 472, and communications module 471. One or more second servers can include a second portion of these modules. In these examples, server 170 can comprise the combination of the first server and the one or more second servers.

In some examples, storage component 473 can include a database 474. Database 474 can be a structured collection of records or data, for instance, which is stored in storage component 473. For example, database 474 can be an XML (Extensible Markup Language) database, MySQL, or an Oracle® database. In the same or different embodiments, database 474 can include a searchable group of individual data files stored in storage component 473. In some embodiments, database 474 can store the list of each of the unused frequency at each location. For example, database 474 can store the GPS coordinates, the signal strength information, and a time stamp for the signal strength information.

Communications module 471 can be configured to communicate information from identifier module 472 to system 101 or system 185 (FIG. 1) via transmission device 180 (FIG. 1). In the same or different embodiments, communications module 471 can receive communications from system 101 and other systems.

In various embodiments, operating system 475 is a software program that manages the hardware and software resources of a computer and/or a computer network. Operating system 475 performs basic tasks such as, for example, controlling and allocating memory, prioritizing the processing of instructions, controlling input and output devices, facilitating networking, and managing files. Examples of common operating systems include the Microsoft® Windows® operating system (OS), Mac® OS, UNIX® OS, and Linux® OS.

Figure 5:
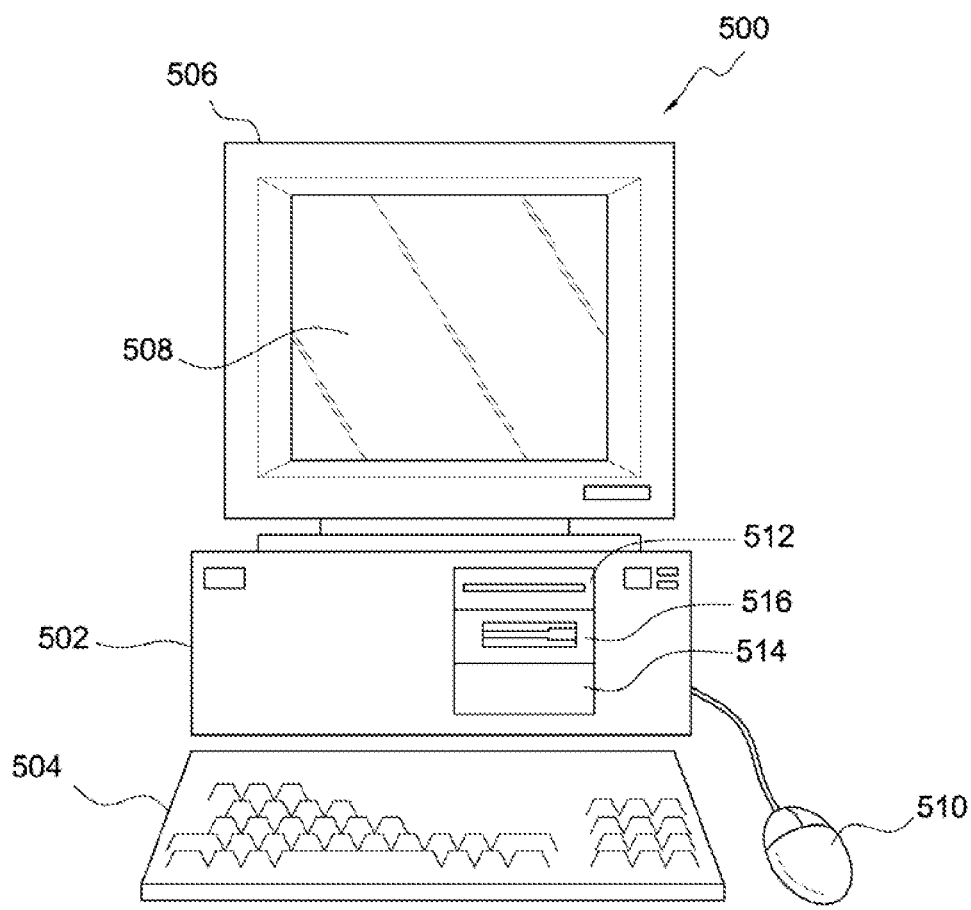
FIG. 5 illustrates a computer that is suitable for implementing an embodiment of the server of FIG. 4.
Figure 6:
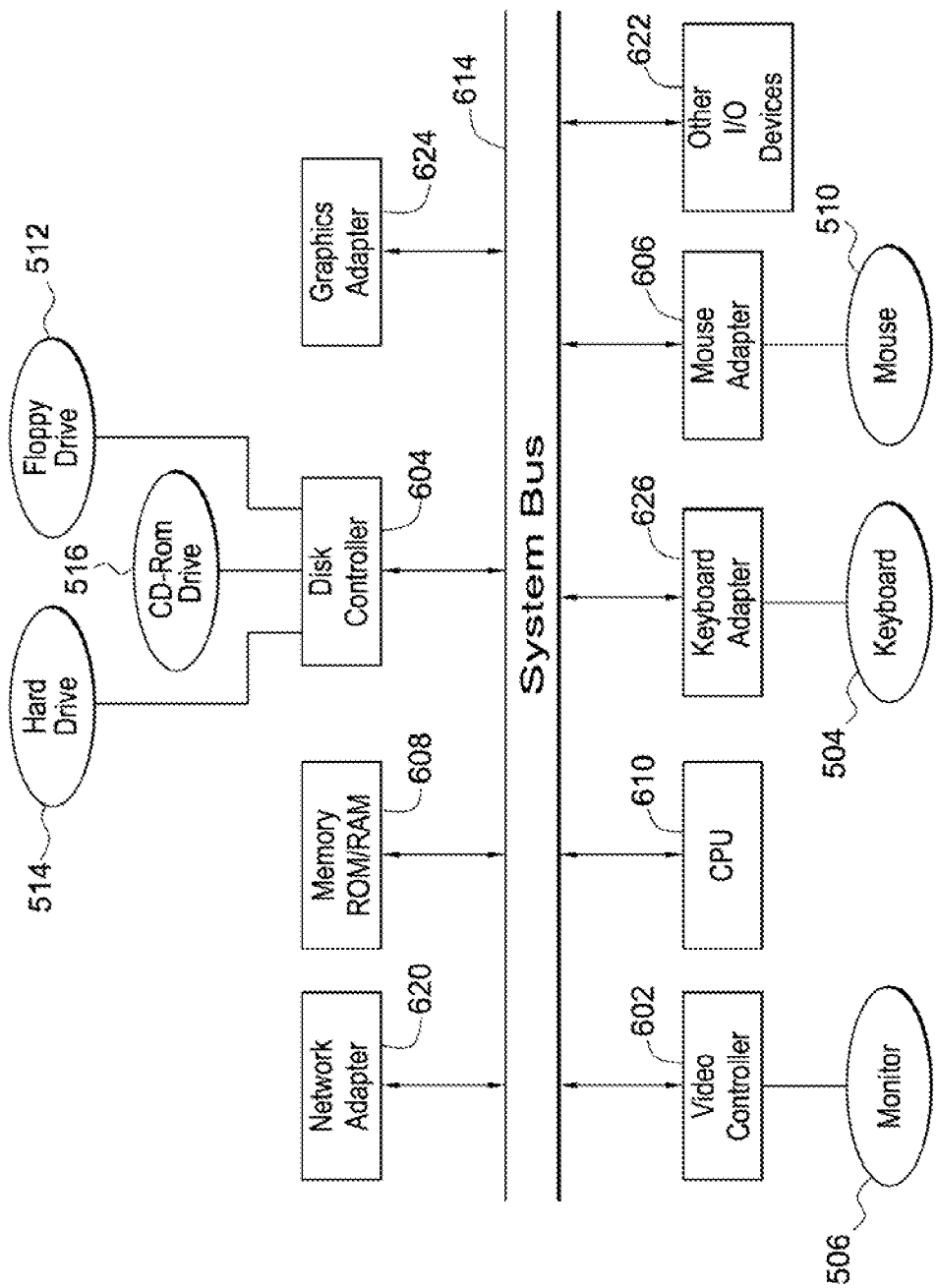
FIG. 6 illustrates a representative block diagram of an example of the elements included in the circuit boards inside chassis of the computer of FIG. 5.

FIG. 5 illustrates a computer 500 that is suitable for implementing an embodiment of server 170 (FIGS. 1 and 4). Computer 500 includes a chassis 502 containing one or more circuit boards (not shown), a floppy drive 512, a Compact Disc Read-Only Memory (CD-ROM) drive 516, and a hard drive 514. A representative block diagram of the elements included on the circuit boards inside chassis 502 is shown in FIG. 6. A central processing unit (CPU) 610 in FIG. 6 is coupled to a system bus 614 in FIG. 6. In various embodiments, the architecture of CPU 610 can be compliant with any of a variety of commercially distributed architecture families including the RS/6000 family, the Motorola 68000 or later families. or the Intel x86 or later families.

System bus 614 also is coupled to memory 608 that includes both read-only memory (ROM) and random access memory (RAM). Non-volatile portions of memory 608 or the ROM can be encoded with a boot code sequence suitable for restoring computer 500 (FIG. 5) to a functional state after a system reset. In addition, memory 608 can include microcode such as a Basic Input-Output System (BIOS).

In the depicted embodiment of FIG. 6, various input/output (PO) devices such as a disk controller 604, a graphics adapter 624, a video controller 602, a keyboard adapter 626, a mouse adapter 606, a network adapter 620, and other I/O device adapters 622 can be coupled to system bus 614. Keyboard adapter 626 and mouse adapter 606 are coupled to a keyboard 504 (FIGS. 5 and 6) and a mouse 510 (FIGS. 5 and 6), respectively, of computer 500 (FIG. 5). While graphics adapter 624 and video controller 602 are indicated as distinct units in FIG. 6, video controller 602 can be integrated into graphics adapter 624, or vice versa in other embodiments. Video controller 602 is suitable for refreshing a monitor 506 (FIGS. 5 and 6) to display images on a screen 508 (FIG. 5) of computer 500 (FIG. 5). Disk controller 604 can control hard drive 514 (FIGS. 5 and 6), floppy drive 512 (FIGS. 5 and 6), and CD-ROM drive 516 (FIGS. 5 and 6). In other embodiments, distinct units can be used to control each of these devices separately.

Although many other components of computer 500 (FIG. 5) are not shown, such components and their interconnection are well known to those of ordinary skill in the art. Accordingly, further details concerning the construction and composition of computer 500 and the circuit boards inside chassis 502 (FIG. 5) need not be discussed herein. Also, in some examples, computer 500 (FIG. 5) does not include all of the elements shown in FIGS. 5 and 6. For example, computer 500 (FIG. 5) might not include a mouse 510 (FIGS. 5 and 6) and/or keyboard 504 (FIGS. 5 and 6). Accordingly, computer 500 is merely exemplary and is not limited to the specific embodiments or examples presented herein. Computer 500 can be employed in many different embodiments or examples not specifically depicted or described herein.

When computer 500 in FIG. 5 is running, program instructions stored on a floppy disk in floppy drive 512, on a CD-ROM in CD-ROM drive 516, on hard drive 514, or in memory 608 (FIG. 6) are executed by CPU 610 (FIG. 6). A portion of the program instructions, stored on these devices, can be suitable for carrying out the method of determining one or more useable radio frequencies in one or more first predetermined geographic area as herein.

Figure 7:
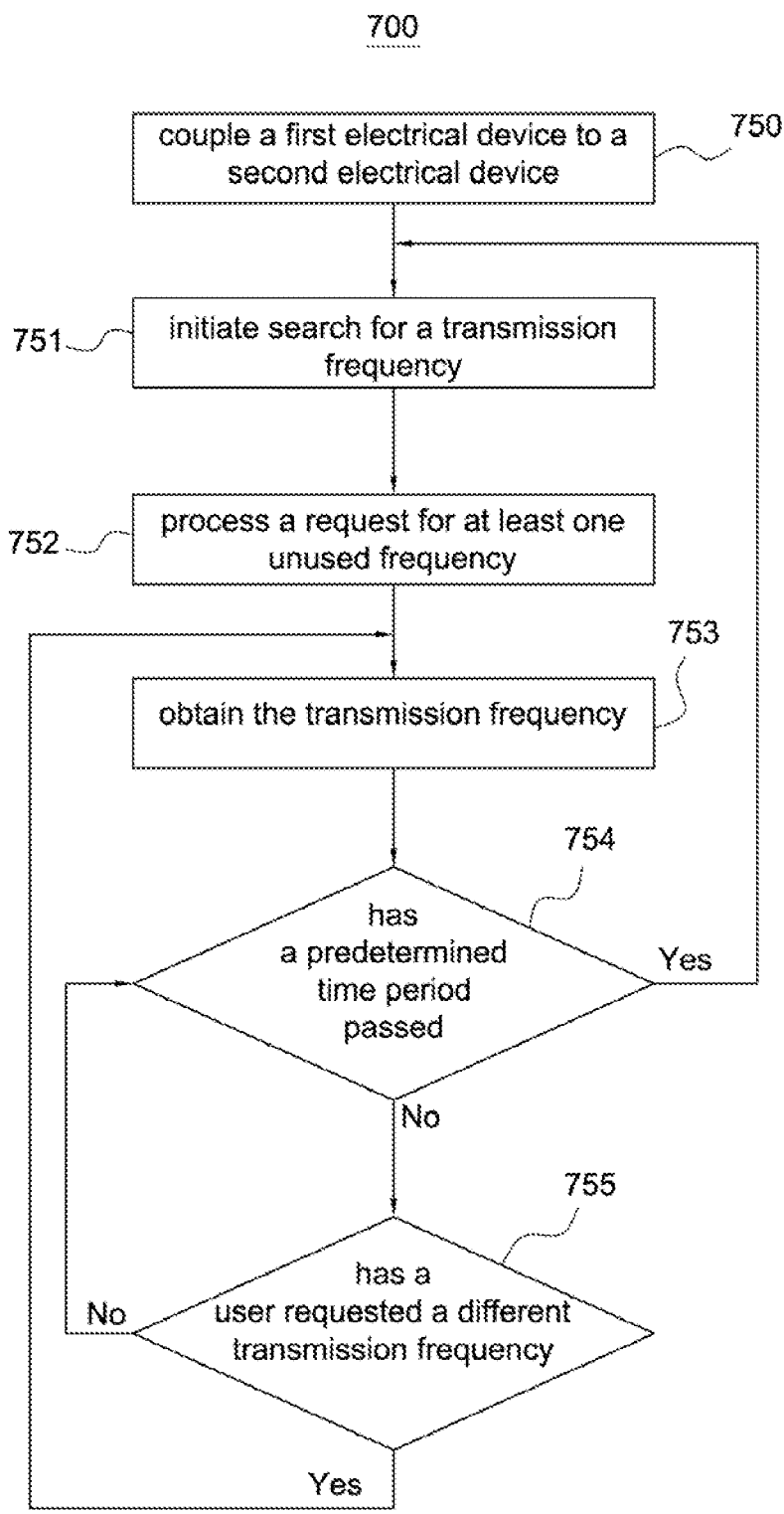
FIG. 7 illustrates a flow chart of an example of a method of transmitting electrical signals, according to the first embodiment.

FIG. 7 illustrates a flow chart of an example of a method 700 of transmitting electrical signals, according to the first embodiment. Method 700 can also be considered a method for selecting transmission frequencies. Method 700 is merely illustrative of a technique for implementing the various aspects of certain embodiments described herein, and system 100 (FIG. 1), and method 700 is not limited to the particular embodiments described herein, as numerous other embodiments are possible.

Referring to FIG. 7, a first activity in method 700 is an activity 750 of coupling the first electrical device to a second electrical device. As an example, the first electrical device and the second device can be identical or similar to electrical devices 140 and 110 of FIG. 1, respectively.

Figure 8:
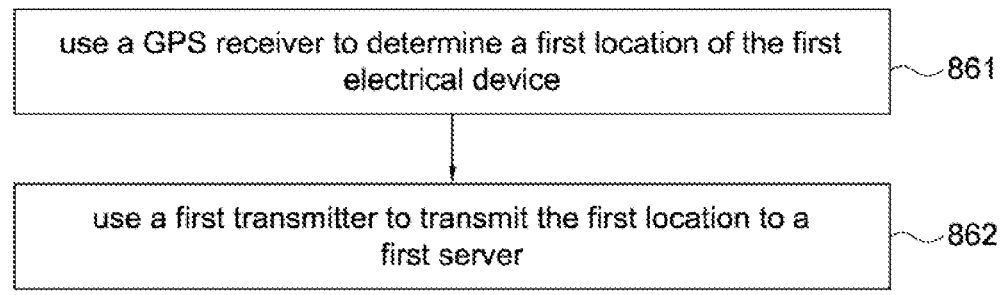
FIG. 8 is a flow chart illustrating an example of an activity of initiating a search for a transmission frequency, according to the first embodiment.

The next activity in method 700 is an activity 751 of initiating a search for a transmission frequency. FIG. 8 is a flow chart illustrating an example of activity 751 of initiating search for transmission frequency, according to the first embodiment.

The first procedure of activity 751 of FIG. 8 is a procedure 861 of using a GPS receiver to determine a first or current location of the first electrical device. In some examples, the GPS receiver can be similar or identical to GPS receiver 344 of FIG. 3. If the current location is not available from the GPS receiver, system 101 (FIG. 1) can use the last measured coordinates of the first electrical device.

Activity 751 in FIG. 8 continues with a procedure 862 of using a first transmitter to transmit the first location to a first server. That is, in some embodiments, the first transmitter can transmit the GPS coordinates (or a part thereof) of the first electrical device, as determined by the GPS receiver, to the first server. In some examples, the first transmitter and the first server can be similar or identical to transmitter 342 and server 170 of FIG. 1, respectively. In some examples, the first transmitter transmits the first location to the first server over a cellular phone network. In other embodiments, the first transmitter transmits the first location to the first server over a computer network. In the same or different embodiments, the first transmitter transmits the first location to the first server using both a cellular phone network and a computer network. In various examples, the transmitter transmits the first location to the first server via transmission device 180 of FIG. 1.

Also, in some examples, in addition to transmitting the first location, a request for a predetermined quantity of unused frequencies can be sent. That is, system 101 can send a request that server 170 return a specific predetermined number of unused frequencies (e.g., ten unused frequencies). After procedure 861, activity 751 is complete.

Figure 9:
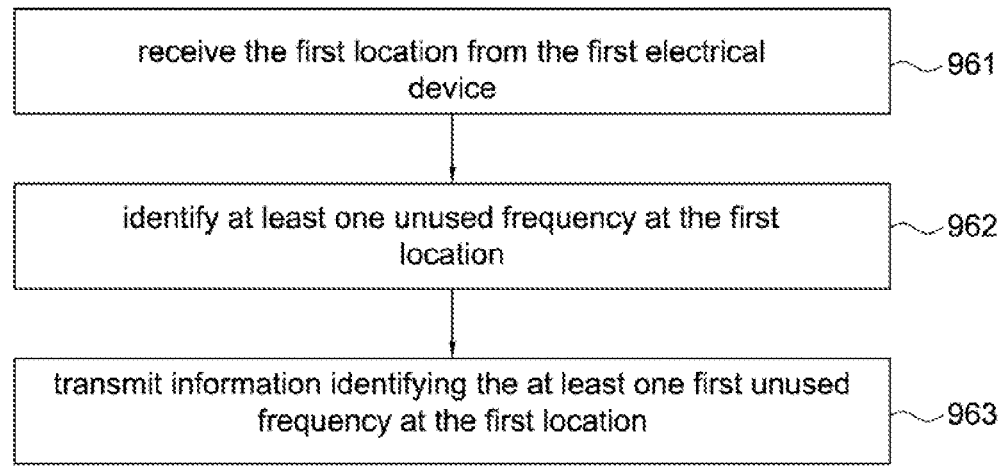
FIG. 9 is a flow chart illustrating an example of an activity of processing a request for at least one unused frequency, according to the first embodiment.

Referring again to FIG. 7, method 700 in FIG. 7 continues with an activity 752 of processing a request for at least one unused frequency. FIG. 9 is a flow chart illustrating an example of activity 752 of processing the request for at least one unused frequency, according to the first embodiment.

Referring to FIG. 9, the first process of activity 752 of FIG. 9 is a procedure 961 of receiving the first location from the first electrical device. In numerous examples, the communications module 471 (FIG. 4) can receive the first location. In some examples, when the first server receives the first location from the first electrical device, the first server interprets the sending of the first location as a request for at least one unused frequency at the first location. In other examples, the first electrical device can include additional information with the first location that specifically requests the first server to send the first electrical device a predetermined number of unused frequencies.

Subsequently, activity 752 of FIG. 9 includes a procedure 962 of identifying at least one unused frequency at the first location. In some examples, identifier module 472 (FIG. 4) can identify the at least one unused frequency at the first location. In various embodiments, identifier module 472 retrieves the at least one unused frequency from the list of unused frequencies stored in database 474 (FIG. 4). In other examples, the procedure (i.e. procedure 1264) described in FIG. 13 can be used to identify the at least one unused frequency.

In many examples, database 474 does not store a list of unused frequencies at every exact GPS coordinates on the Earth's surface. If server 170 (FIG. 1) receives a set of GPS coordinates from the first electrical device, identifier module 472 can retrieve from database 474 at least one unused frequency in a geographical region that contains the set of GPS coordinates of the first electrical device.

As used herein, "location" or "geographic area" does not refer to an exact location but refers to a geographical region. In various embodiments, the Earth or a specific country or region can be divided into two or more locations or geographical regions. In various examples, a location or geographic area can be a geographical region with the same postal code (e.g., the geographical region with U.S. Zip Code 22554 could be a single location or geographic area), country, or province. In other examples, a location or geographic area can be a geographical region within a circle or other shape. The circle is centered at a predetermined point on the Earth's surface and has a predetermined radius. In some examples, the radius of the circle can be one kilometer or five kilometers.

In other examples, the size and shape of a location or geographical area can be determined using factors such as population density and the number of data points available for a given geographical region. In one example, urban regions or suburban regions can be divided into smaller locations or geographical areas compared to rural regions because more sources of interference exist in urban areas, and these sources of interference can be very localized. For example, in an urban area, the geographical area can be a single block, and in a rural area, the geographical area can be twenty kilometers. In still other embodiments, the location or geographic area can be a set of GPS coordinates.

In the same or different example, the size and shape of each of the locations or geographical areas can be determined by the amount of data regarding unused frequencies in the geographical region. As will be described in detail below, the first server can receive data regarding unused frequencies at a location or geographic area from one or more electrical devices. The first server can use this data to determine the size and shape of the locations and geographical areas. For example, if the first server receives many data points for a given region and if the number of unused frequencies is small, the first server can decrease the size of that location or geographical area. On the other hand, if the first server receives few data points for a given region and the number of unused frequencies is large, the first server can increase the size of that that location or geographical area.

Next, activity 752 of FIG. 9 includes a procedure 963 of transmitting information identifying the at least one first unused frequency at the first location. In some examples, identifier module 472 (FIG. 4) can communicate information identifying the at least one unused frequency to communications module 471 (FIG. 4), which transmits the information identifying the at least one unused frequency to the first electrical device. In some examples, server 170 can transmit a list of unused frequencies with the frequencies listed from the most clear to the least clear. In various embodiments, communication module 471 (FIG. 4) can rank the list of unused frequencies based on the preferences of a single user or of multiple users.

In some examples, communications module 471 can transmit the information identifying the at least one unused frequency to the first electrical device using the same method used by the first electrical device to transmit the first location to the first server in procedure 862 of FIG. 8. After procedure 963, activity 752 is complete.

Figure 10:
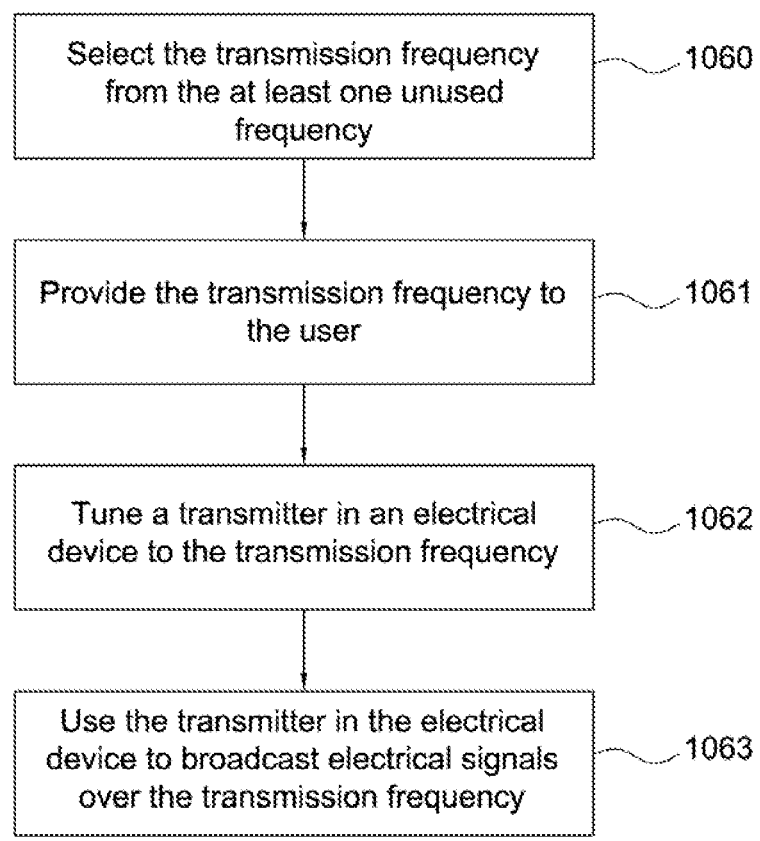
FIG. 10 illustrates a flow chart of an example of an activity of obtaining a transmission frequency, according to the first embodiment.

Referring again to FIG. 7, method 700 in FIG. 7 continues with an activity 753 of obtaining the transmission frequency. FIG. 10 illustrates a flow chart of an example of activity 753 of obtaining a transmission frequency, according to the first embodiment.

Referring to FIG. 10, the first procedure in activity 753 is a procedure 1060 of selecting the transmission frequency from at least one unused frequency. Procedure 1060 can be performed automatically. In some examples, selection module 213 (FIG. 2) can select the transmission frequency from information identifying at least one first unused frequency received by receiver 211 (FIG. 2). If the request for a transmission frequency is the first time the request is made, the first carrier frequency on the list of unused frequencies can be selected.

In some embodiments, selection module 213 (FIG. 2) can keep a list of carrier frequencies used within a predetermined time period (e.g., fifteen minutes). Keeping a list of used frequencies can prevent selection module 213 from repeatedly providing the same carrier frequency to the user.

In some examples, selection module 213 (FIG. 2) can mark the carrier frequencies as used when provided to the user. In some embodiments, if a carrier frequency is marked as used, this carrier frequency will not be provided to the user again within the predetermined time period. In a different embodiment, a carrier frequency will not be provided to the user again unless activity 753 (FIG. 7) is repeated.

If the request is not the first time the request for a transmission frequency is made, selection module 213 (FIG. 2) can select the next unused carrier frequency not previously selected in the predetermined time period. If all of the unused carrier frequencies have been selected one or more times in the predetermined time period, selection module 213 (FIG. 2) can provide the one or more unused carrier frequencies to the user again in some examples, or method 700 can revert back to activities 751 and/or 752 (FIG. 7).

After selecting the transmission frequency, the next procedure in activity 753 is a procedure 1061 of providing the transmission frequency to the user. Procedure 1061 can be performed automatically. In some examples, the transmission frequency is visually displayed to the user on display 121 (FIGS. 1 and 2). In the same or different examples, selection module 213 (FIG. 2) can instruct user communications component 220 (FIG. 2) to display the transmission frequency to the user. In other embodiments, user communications component 220 can provide the transmission frequency in an audible form. In other examples, other methods can be used to provide the transmission frequency to the user.

The next procedure in activity 753 is a procedure 1062 of tuning a transmitter in the electrical device to the transmission frequency. In various examples, selection module 213 (FIG. 2) tunes transmitter 212 (FIG. 2) to the transmission frequency. The tuning can be performed automatically after procedures 1060 and/or 1061.

The subsequent procedure in activity 753 is a procedure 1063 of using the transmitter in the electrical device to broadcast electrical signals over the transmission frequency. In many examples, transmitter 212 (FIG. 2) can broadcast electrical signals (e.g., audio, video, or data signals) received from electrical device 140 (FIG. 1).

In some embodiments, transmitter 212 (FIG. 2) automatically begins to transmit on the transmission frequency after being instructed to transmit the electrical signals. In other examples, transmitter 212 (FIG. 2) waits a predetermined time (e.g., seven seconds) and then begins transmitting. In alternative embodiments, transmitter 212 (FIG. 2) waits for instructions from the user to begin transmitting. In some example, selection module 213 (FIG. 2) instructs transmitter 212 (FIG. 2) to begin transmitting on the transmission frequency. In alternative embodiments, procedure 1063 or procedures 1062 and 1063 can occur before or concurrent with procedure 1061. Other sequences of procedures are also possible.

After procedure 1063, activity 753 is complete, and the next activity in method 700 (FIG. 7) is an activity 754 (FIG. 7) of determining if a predetermined time period (e.g., thirty seconds) has passed.

If the predetermined time has passed, the next activity in method 700 is activity 751 of initiating the search for a transmission frequency. To ensure a clear transmission frequency, it is preferable to repeat activities 751-753 at regular intervals. If electrical device 110 (FIGS. 1 and 2) is moving (e.g., in a vehicle), the carrier frequencies available for use can change. For example, as electrical device 110 (FIGS. 1 and 2) moves from a first geographic area to a second geographic area, the unused carrier frequencies can change. Accordingly, re-receiving the identifying information after a predetermined time ensures that the clearest transmission frequency is presented to the user. In one embodiment, the predetermined time varies depending on the speed of the vehicle, where a longer predetermined time is used for a slower speed and a shorter predetermined time is used for a faster speed.

If the predetermined time has not passed, the next activity in method 700 is an activity 755 of determining whether a user has requested a different transmission frequency. In one example, a user can use input component 222 (FIG. 2) to request a transmission frequency. In one example, if the user requests a transmission frequency through input component 222 (e.g., by pressing a button), user communications component 220 (FIG. 2) can communicate the request to selection module 213 (FIG. 2).

If the user requests a transmission frequency, the next activity in method 700 is an activity 753 of obtaining a transmission frequency. In other embodiments, if a user requests a transmission frequency, activities 751-753 are repeated (not shown in FIG. 7). If a user has not requested a transmission frequency, the next activity is activity 754. In alternative embodiments, activity 753 can occur before or concurrent with activity 754.

Figure 11:
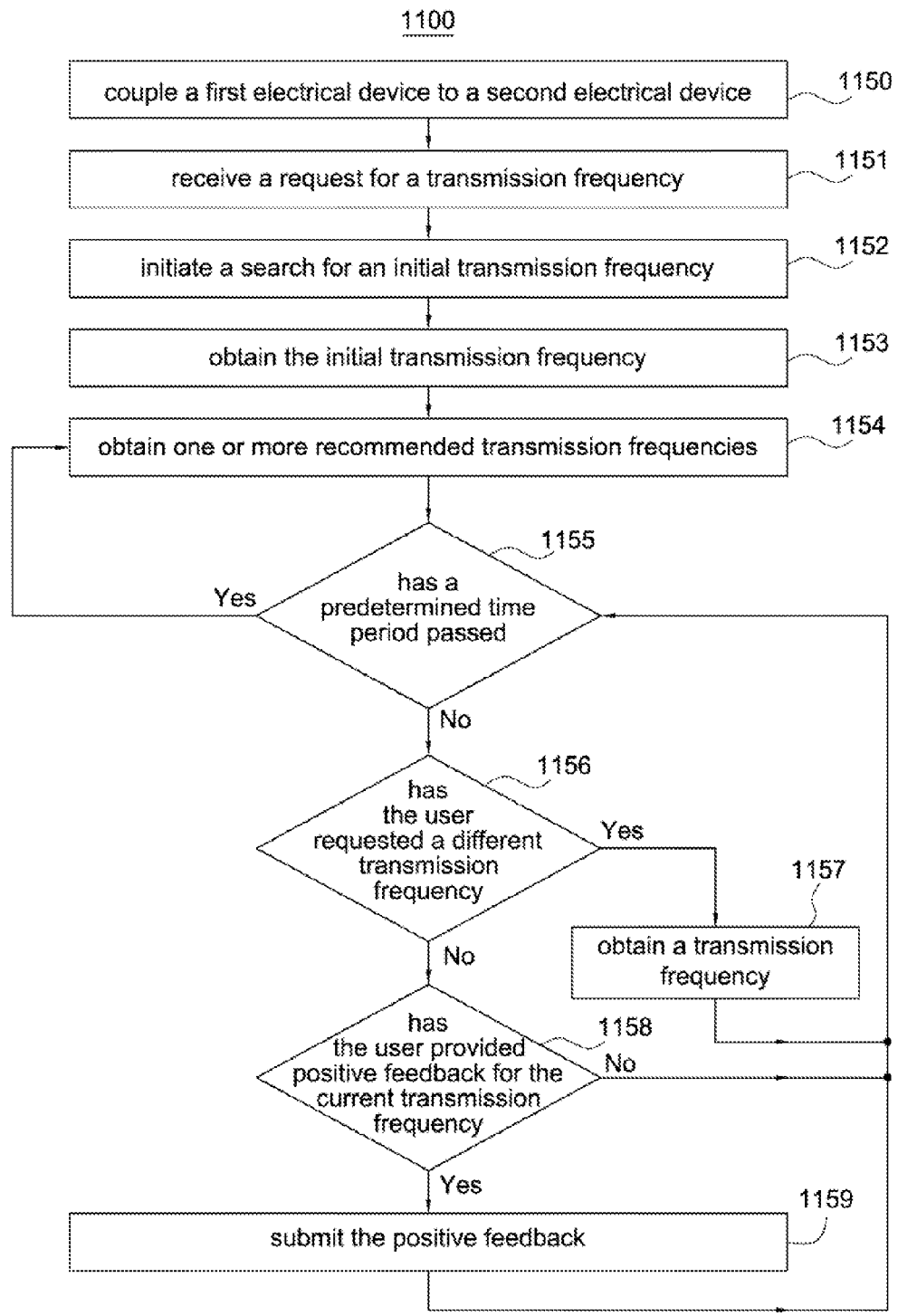
FIG. 11 illustrates a flow chart of an example of a method of transmitting electrical signals, according to a second embodiment.

FIG. 11 illustrates a flow chart of an example of a method 1100 of transmitting electrical signals, according to a second embodiment. Method 1100 can also be considered a method for selecting transmission frequencies. Method 1100 is merely illustrative of a technique for implementing the various aspects of certain embodiments described herein, and system 100 (FIG. 1), and method 1100 is not limited to the particular embodiments described herein, as numerous other embodiments are possible.

Referring to FIG. 11, a first activity in method 1100 is an activity 1150 of coupling a first electrical device to a second electrical device. As an example, the first electrical device and the second device can be identical or similar to electrical device 110 and 140 of FIG. 1, respectively. Activity 1150 can be similar or identical to activity 750 of FIG. 7. In various embodiments, if the first electrical device is already coupled to the second electrical device, activity 1150 can be skipped.

The next activity in method 1100 is an activity 1151 of receiving a request for a transmission frequency. In various embodiments, a user can use input component 222 (FIG. 2) to request the transmission frequency. In one example, if the user requests a transmission frequency through input component 222 (e.g., by pressing a button), user communications component 220 (FIG. 2) can communicate the request to selection module 213 (FIG. 2).

In other embodiments, electrical device 140 (FIGS. 1 and 3) can initiate the request for a transmission frequency without the user requesting a transmission frequency. For example, if a user activates one or more certain applications (e.g., an application to play music) on electrical device 140 when electrical device 140 is coupled to electrical device 110 (FIGS. 1 and 2), electrical device 140 can request a transmission frequency. In yet other embodiments, electrical device 110 can itself request a transmission frequency when electrical device 110 is powered-on and coupled to electrical device 140.

Referring again to FIG. 11, method 1100 continues with an activity 1152 of initiating a search for an initial transmission frequency. In many embodiments, activity 1152 can include determining the initial transmission frequency and an initial list of unused carrier frequencies. Referring back in FIG. 2, in some embodiments, unused frequency identification module 214 can identify one or more unused frequencies. In various examples, unused frequency identification module 214 can use receiver 211 to scan the set of carrier frequencies and measure the signal strength at each carrier frequency. Carrier frequencies with a signal strength below a predetermined value can be added to a list of unused carrier frequencies. In the same or different example, unused frequency identification module 214 can select the one or more first unused frequencies at least partially based on characteristics of the one or more carrier frequencies adjacent to each potential unused frequency. In other examples, unused frequency identification module 214 can identify one or more unused frequencies using the method described in U.S. patent application Ser. No. 12/171,202, filed Jul. 10, 2008. In many embodiments, one or more unused frequencies can be stored in a memory (not shown) in electrical device 110 (FIG. 2) and/or electrical device 140 (FIG. 3).

Referring again to FIG. 11, the next activity in method 1100 is an activity 1153 of obtaining the initial transmission frequency. In some examples, activity 1153 can be similar or identical to activity 753 of FIG. 7.

Figure 12:
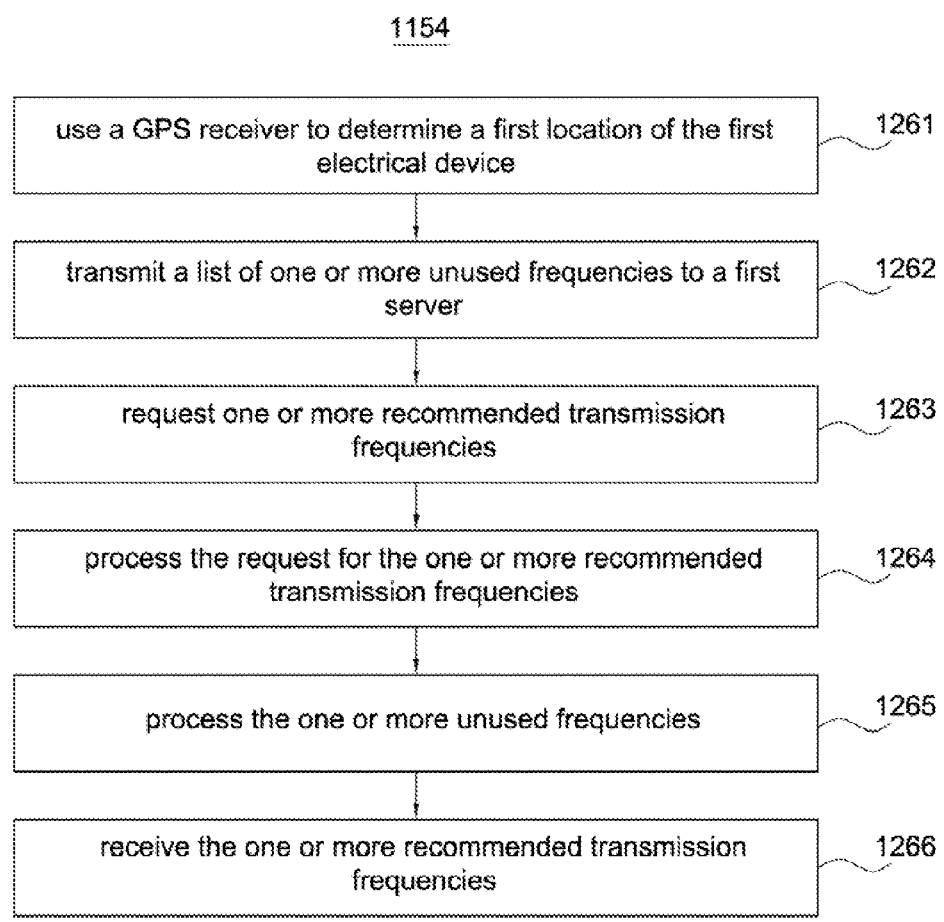
FIG. 12 is a flow chart illustrating an example of an activity of obtaining one or more recommended transmission frequencies, according to the second embodiment.

Subsequently, method 1100 of FIG. 11 includes an activity 1154 of obtaining one or more recommended transmission frequencies. That is, system 101 (FIG. 1) can request identifying information for at least one unused carrier frequency from server 170 (FIG. 7). FIG. 12 is a flow chart illustrating an example of activity 1154 of obtaining one or more recommended transmission frequencies, according to the second embodiment.

The first procedure of activity 1154 of FIG. 12 is a procedure 1261 of using a GPS receiver to determine a first location of the first electrical device. In some examples, procedure 1261 can be similar or identical to procedure 861 of FIG. 8. In some examples, the first location is the GPS coordinates of electrical device 110 (FIG. 2) or electrical device 140 (FIG. 3).

Activity 1154 in FIG. 12 continues with a procedure 1262 of transmitting a list of one or more unused frequencies to a first server. In some examples, the list of unused carrier frequencies can be transferred to the first server. In various embodiments, the first transmitter and the first server can be similar or identical to transmitter 342 (FIG. 3) and server 170 (FIG. 1), respectively. In some examples, the first transmitter transmits the list of unused carrier frequencies to the first server over a cellular phone network, a computer network, or a combination thereof. In various examples, the transmitter transmits the first location to the first server via transmission device 180 of FIG. 1.

In many embodiments, the current GPS coordinates of electrical device 140 (FIG. 1) along with the signal strength of each of the unused carrier frequencies, calculated in activity 1152 (FIG. 11), are transmitted to the first server. In other embodiments, only information about the initial transmission frequency and the current GPS coordinates of electrical device 140 (FIG. 1) are transmitted to the first server. In the same or different embodiment, any user rating information about the unused carrier frequencies is transmitted to the first server.

The first server can use the list of unused carrier frequencies along with other information received from system 101 (FIG. 1) and other systems to calculate lists of recommended unused carrier frequencies at the first location and other locations in the vicinity of the first location.

Subsequent, activity 1154 in FIG. 12 continues with a procedure 1263 of requesting one or more recommended transmission frequencies. In some examples, the request can be to the first server and can include the current GPS coordinates of electrical device 110 and/or 140 (FIG. 1) and a request for a quantity of recommended frequencies. In some examples, the default quantity of recommended transmission frequencies is ten. In various embodiments, the actual quantity of recommended frequencies returned can be limited by the amount of relevant frequencies available to the first server.

In some embodiments, procedures 1262 and 1263 can be combined into a single procedure. Combining the procedures has the advantage of decreasing the amount of information that needs to be transferred between the first transmitter and the first server. For example, transferring of the list of unused carrier frequencies with the GPS coordinates can also serve as a request for recommended frequencies from the first server. In other examples, a request for the recommended frequencies can be transmitted with the list of unused carrier frequencies.

In other embodiments, the list of unused carrier frequencies, calculated in activity 1152 (FIG. 11) is not sent to the first server (i.e., procedure 1262 is skipped) and only the request for recommended frequencies is sent to the first server. In these embodiments, other methods can be used to obtain lists of unused carrier frequencies at the GPS coordinates of system 101 (FIG. 1).

Next, activity 1154 in FIG. 12 included a procedure 1264 of processing the request for the one or more recommend transmission frequencies. In some embodiments, procedure 1264 can be similar or identical to activity 752 of FIGS. 7 and 9. In other embodiments, FIG. 13 illustrates an example of procedure 1264 of processing the request for the one or more recommend transmission frequencies, according to the second embodiment.

Figure 13:
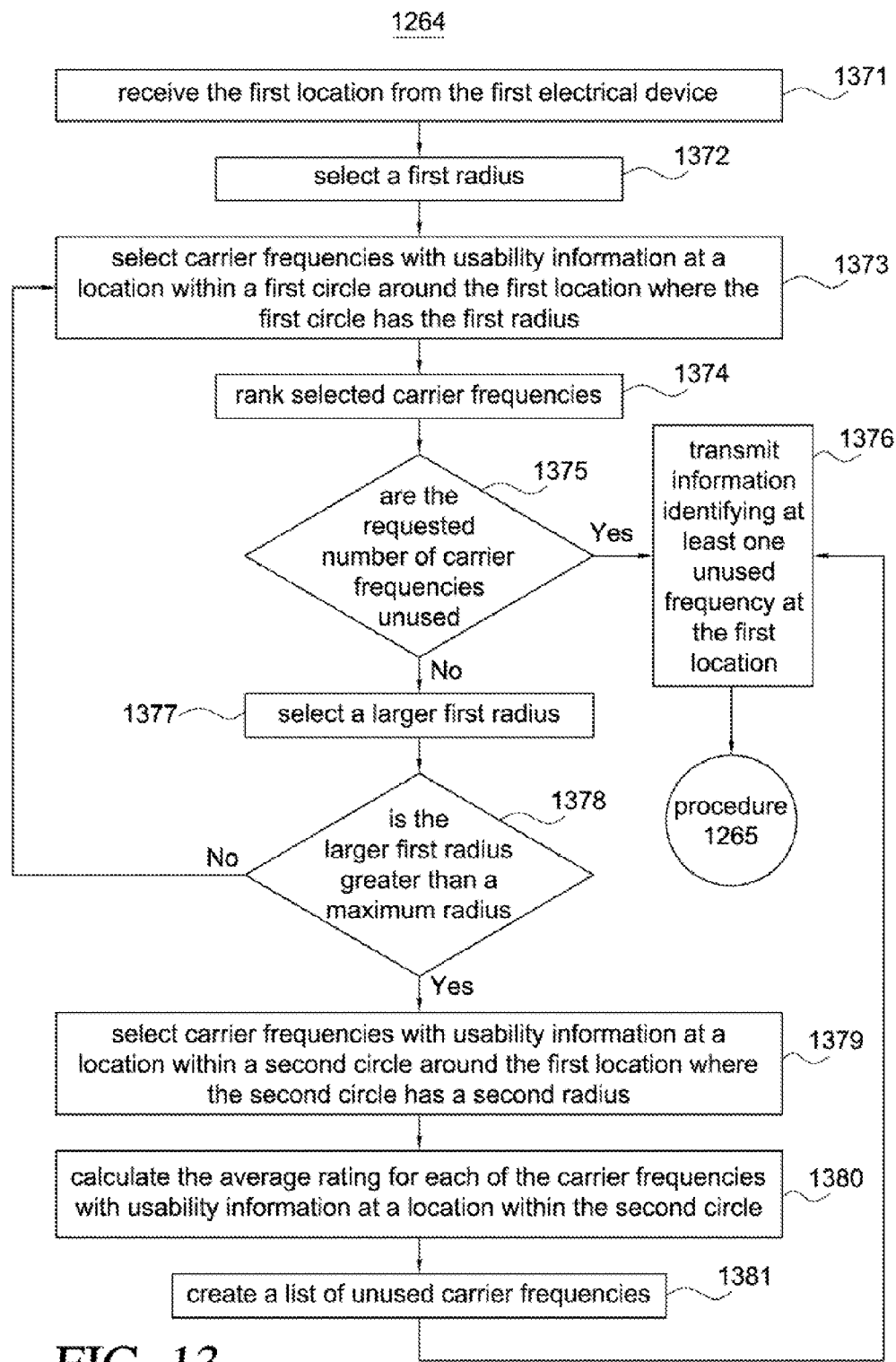
FIG. 13 illustrates an example of a procedure of processing a request for the one or more recommend transmission frequencies, according to the second embodiment.

Referring to FIG. 13, the first process in procedure 1264 is a process 1371 of receiving the first location from the first electrical device. In some examples, process 1371 can be similar or identical to procedure 961 of FIG. 9.

Subsequently, procedure 1264 of FIG. 13 includes a process 1372 of selecting a first radius. In some embodiments, the first radius could be selected in process 1372 to be between one kilometers (km) and sixteen kilometers. For example, the first radius can be four km. In some examples, identifier module 472 (FIG. 4) can select the first radius. The first radius can be selected to be used in the search for unused carrier frequencies, as described below. Basically, unused frequencies within the first radius of the first location will be identified using the procedures described below.

Selecting a first radius can involve balancing: (a) the desire to keep the first radius as small as possible so as to provide the most accurate information regarding which carrier frequencies are unused at the first location; and (b) the fact that signal strength information will be available for a smaller number of carrier frequencies when using a smaller radius. As will be described below, the iterative process of procedure 1264 tries to provide both the most accurate information while providing a reasonable number of potential unused carrier frequencies.

Procedure 1264 of FIG. 13 continues with a process 1373 of selecting carrier frequencies with usability information at a location within a first circle around the first location, where the first circle has the first radius. In some examples, identifier module 472 (FIG. 4) can query database 474 (FIG. 4) for the list of all carrier frequencies that have usability information at coordinates within the first radius of the GPS coordinate of system 101 (FIG. 1).

The next process in procedure 1264 is a process 1374 of ranking the selected carrier frequencies. In some examples, the carrier frequencies that have usability information at coordinates within the first radius of the GPS coordinates of system 101 (FIG. 1) are ranked based on their usability information.

In many embodiments, users of electrical devices 110 and 140 (FIG. 1) can submit to server 170 (FIG. 1) their rating of carrier frequencies that they use (e.g., procedure 1262 (FIG. 12), activity 1156 (FIG. 11), and/or activity 1158 (FIG. 11)). These ratings can be stored in database 474 (FIG. 4) and used in process 1374 to rank the carrier frequencies (i.e., the usability information includes the user ratings). For example, as described in relation to activities 1156 and 1158 (FIG. 11) below, a user could submit a positive or negative (i.e., thumbs up or thumbs down) rating for the carrier frequency that she is currently using. The user rating along with the GPS coordinates of the user when the user rating was submitted could be stored in database 474 (FIG. 4). In some embodiments, a positive user rating could be counted as a +1 and a negative user rating could be counted as a −1. In process 1374, all of the user rating for each carrier frequency with ratings at coordinates within the first radius of the first location could be summed to create a cumulative rating for each carrier frequency at the first location.

In other examples, the signal strength information calculated in activity 1152 (FIG. 11) and transmitted to the first server in procedure 1262 (FIG. 12) could be used instead of the user ratings. In this embodiment, the usability information can be signal strength data that was received from one or more electronic devices and stored in database 474 (FIG. 4). The carrier frequencies with signal strength data for coordinates with the first circle can be ranked based on their signal strengths with the carrier frequencies with the lowest average signal strength having the highest cumulative rating.

In still other examples, procedure 1262 (FIG. 12) can be used instead of the user ratings. In still other examples, both the user ratings and the signal strength data can be used together to calculate the cumulative ratings. In some examples, identifier module 472 (FIG. 4) can determine the cumulative ratings.

Procedure 1264 in FIG. 13 further includes a process 1375 of determining whether the requested quantity of frequencies is unused. That is, identifier module 472 (FIG. 4) can determine whether the cumulative rating for each of the carrier frequencies that have a signal strength rating and/or a user rating at coordinates within the first radius of the GPS coordinates of system 101 (FIG. 1) is less than or greater than a predetermined value, respectively, and considered an unused frequency at the first location. In the example where a positive user rating can be counted as a +1 and a negative user rating can be counted as a −1, a cumulative rating of +10 can be considered an unused frequency in some examples. In a different examples, a carrier frequency can be considered unused if its average signal strength is below a predetermined value or threshold.

If the requested number of carrier frequencies have an acceptable rating, the next process in procedure 1264 is a process 1376 of transmitting information identifying for the at least one unused carrier frequency at the first location. In some examples, process 1376 can be similar or identical to procedure 963 of FIG. 9.

If more than the requested number of carrier frequencies has acceptable ratings, identifier module 472, as part of process 1375, can identify the requested number of carrier frequencies with the best ratings, and information identifying this set of unused carrier frequencies can be transmitted in process 1376.

If less than the requested number of carrier frequencies has acceptable ratings, the next process in procedure 1264 is a process 1377 of selecting a larger first radius. When process 1377 occurs, either server 170 (FIG. 1) does not have enough data to determine the requested number of unused frequencies within the first circle or the requested number of unused carrier frequencies in the first circle does not exist. Accordingly, a new radius is selected in process 1377. In some embodiments, identifier module 472 (FIG. 4) can select a new first radius larger than the previous first radius. In some examples the new first radius is between one kilometers (km) and sixteen kilometers. In the same or different examples, the new radius can be 4 km larger than the previous predetermined radius.

Subsequently, procedure 1264 of FIG. 13 includes a process 1378 of determining whether the larger first radius is greater than a maximum radius. In some examples, procedure 1264 includes process 1378 because if the first radius is too large, the data regarding the usability of the carrier frequency might be too remote from the user's location to accurately predict what carrier frequencies are unused at the GPS coordinates of system 101 (FIG. 1). For example, if the first radius was 50 km in one example, data showing a carrier frequency is unused 50 km from the GPS coordinates of system 101 (FIG. 1) is too attenuated and distant to accurately predict if a carrier frequency is unused at the GPS coordinates of system 101 (FIG. 7).

If the new predetermined first radius is smaller than or equal to the predetermined maximum radius, the next process is process 1373. If the new radius is greater than the maximum radius, the next process is a process 1379.

Process 1379 of FIG. 13 includes selecting carrier frequencies with usability information at a location within a second circle, where the second circle has a second radius. In some examples, the second radius can be between one km and sixteen km (e.g., eight km). Generally, the second radius is less than the maximum radius but greater than the first radius selected in process 1372.

The next process in procedure 1264 of FIG. 13 is a process 1380 of calculating the average rating for each of the carrier frequencies with usability information at a location within the second circle. In the examples where the usability information is the signal strength, the average rating is calculating by finding the average signal strength for the carrier frequency in the second circle.

In the example where a positive user rating can be counted as a +1 and a negative user rating can be counted as a −1, the average rating is calculated by averaging the user rating of a carrier frequency.

Procedure 1264 continues with a process 1381 of creating a list of unused frequencies. In some examples, the list is created in two parts. A first part of the list is generated by a process similar or identical to ranking the carrier frequencies in process 1374. The second part of the list is generated using the average frequency calculated in process 1380.

That is, the first part of the list is created by ranking the carrier frequencies based on their cumulative rating within the second circle. The list of carrier frequencies is completed by appending to the first part of the list the carrier frequencies with the highest average rating, as calculated in process 1380. That is, the number of carrier frequencies appended to the list created in the first part can be the number of carrier frequencies need to create a list with the requested number of unused frequencies. For example, if ten unused frequencies were requested and if the first part of the list of unused frequencies includes six frequencies, the four frequencies with the highest average rating, which are not on the first part of the list, are appended to the list to create a list of ten unused frequencies to be transmitted to system 101 (FIG. 1).

In other examples, other processes can be used to create the list of unused frequencies in process 1380. For example, the list of unused frequencies can be generated using only the average rating calculated in process 1380 or only the cumulative rating calculated in a manner similar to the process described in process 1374.

After the list of unused carrier frequencies are created in process 1381, the next procedure is process 1376 of transmitting information identifying the at least one unused carrier frequencies at the first location. After process 1376, procedure 1264 is complete, and the next procedure is procedure 1265 of FIG. 12.

Referring again to FIG. 12, activity 1154 in FIG. 12 includes a procedure 1265 of processing the one or more unused carrier frequencies. In some examples, the method of processing the list of unused carrier frequencies sent in procedure 1262 is described later in method 1400 of FIG. 14.

Activity 1154 in FIG. 12 further includes a procedure 1266 of receiving the one or more recommended transmission frequencies. In some examples, receiver 343 (FIG. 3) can receive the one or more recommended transmission frequencies from server 170 (FIG. 1). The recommended transmission frequencies can be stored in memory (not shown) of electrical device 140 (FIGS. 1 and 3) and/or electrical device 110 (FIGS. 1 and 2). The one or more recommend transmission frequencies received in procedure 1266 can replace the current list of unused frequencies, if any. After procedure 1266 is complete, activity 1154 is complete.

In other examples, procedures 1264 and 1265 can occur concurrently, or procedure 1265 can occur before procedure 1264. In the same or different examples, procedures 1265 and 1266 can occur concurrently, or procedure 1266 can occur before procedure 1265.

Referring again to FIG. 11, the next activity in method 1100 is an activity 1155 of determining if a predetermined time period (e.g., thirty seconds or five minutes) has passed. In some examples, the predetermined time period is measured from the later of the beginning of activity 1150 or from the last occurrence of activity 1155. If the predetermined time period has passed, the next activity in method 1100 is activity 1154 of obtaining of one or more recommended frequency.

If the predetermined time period has not passed, the next activity in method 1100 is an activity 1156 of determining whether a user has requested a different transmission frequency. In one example, a user can use input component 222 (FIG. 2) to request a transmission frequency. If the user requests a transmission frequency through input component 222 (e.g., by pressing a button), user communications component 220 (FIG. 2) can communicate the request to selection module 213 (FIG. 2).

In some examples, a user of system 101 can press a negative (e.g., a thumbs-down) rating button to request a new unused transmission frequency. In some examples, the negative rating can be submitted to server 170 (FIG. 1) or stored locally in system 101 (FIG. 1). In other examples, system 101 can include separate mechanisms to: (a) negatively rate a carrier frequency; and (b) request a new unused frequency.

If the user requests a different transmission frequency, the next activity in method 1100 is an activity 1157 of obtaining a transmission frequency. In some examples, activity 1157 can be similar or identical to activity 1153. After activity 1157, the next activity is activity 1155. In other embodiments, if a user requests a different transmission frequency in activity 1156, activity 1154 is performed before activity 1157 (not shown in FIG. 11).

If a user has not requested a transmission frequency in activity 1156, the next activity is an activity 1158 of determining whether the user has provided positive feedback regarding the current transmission frequency. In some examples, in addition to the negative rating mechanism discussed above, electrical device 110 (FIG. 1) or electrical device 140 (FIG. 1) can include a positive feedback mechanism (e.g., a thumbs-up button). In other examples, electrical device 110 or 140 can include a mechanism for the user to provide a rating (e.g., a rating on a scale of one to five) of the current transmission frequency. If the user has not provided positive feedback regarding the current transmission frequency, the next activity in method 1100 is activity 1155.

If the user has provided positive feedback, the next activity in method 1100 is an activity 1159 of submitting the positive feedback. In many embodiments, the current GPS coordinates of electrical device 140 (FIG. 1) along with current transmission along with the positive feedback is transmitted to the first server. The information can be transmitted similar to the transmission of the information in procedure 1262 of FIG. 12. After activity 1159, the next activity in method 1100 is activity 1155. In some embodiments, activity 1158 is not performed or occurs before or concurrent with activity 1156.

Figure 14:
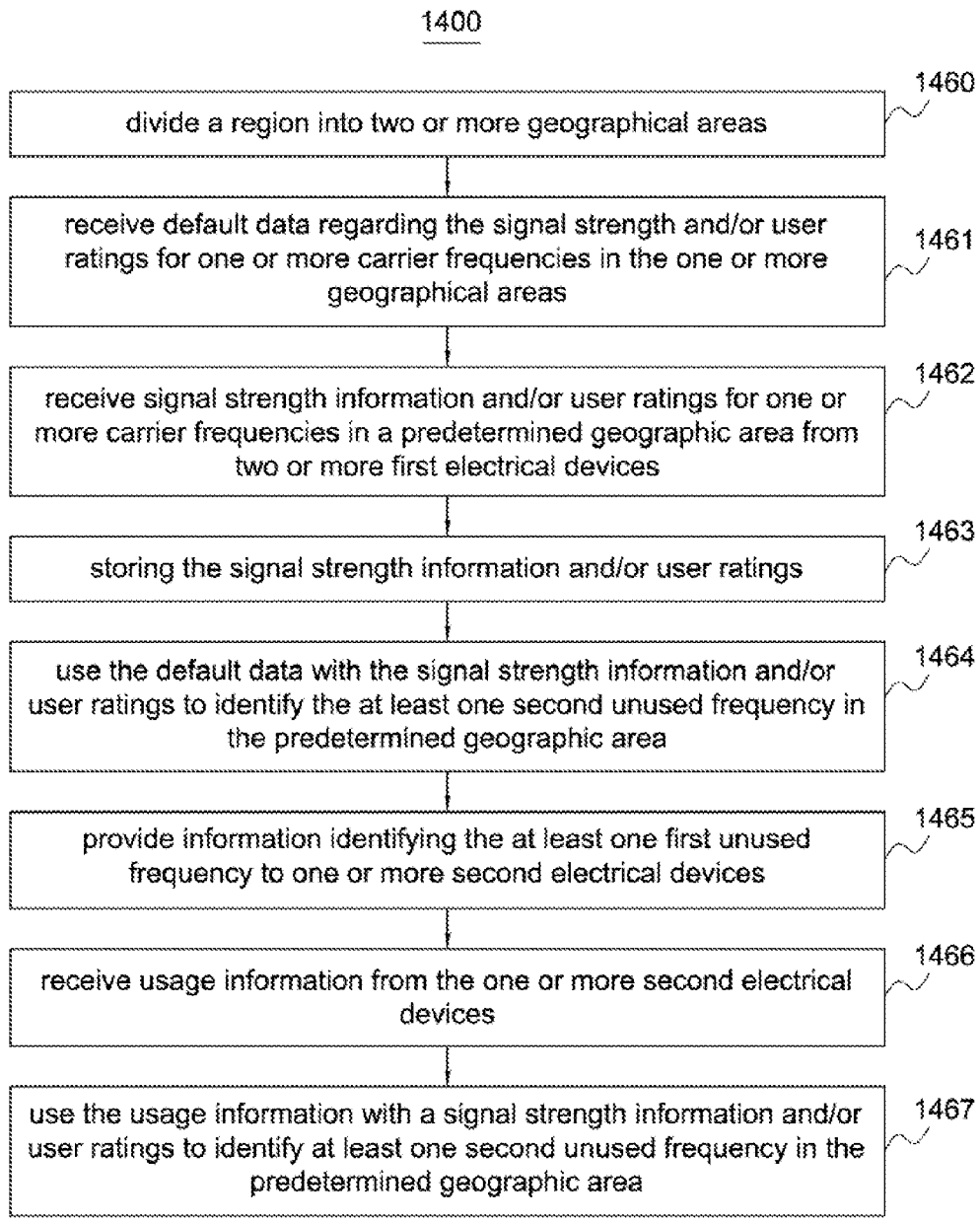
FIG. 14 illustrates a flow chart of an example of a method of determining one or more useable radio frequencies in one or more first predetermined geographic areas, according to a third embodiment.

FIG. 14 illustrates a flow chart of an example of a method 1400 of determining one or more useable radio frequencies in one or more first predetermined geographic areas, according to a third embodiment. Method 1400 can also be considered a method for identifying or processing transmission frequencies. Method 1400 is merely illustrative of a technique for implementing the various aspects of certain embodiments described herein, and system 100 (FIG. 1), and method 1400 is not limited to the particular embodiments described herein, as numerous other embodiments are possible.

Referring to FIG. 14, a first activity in method 1400 is an activity 1460 of dividing a region into two or more geographical areas. In some examples, the region could be the whole United States and Canada. In another example, the area could be Japan, Mexico, Australia, Korea, Europe, a single state, county, providence, or city. In some embodiments, the region needs to be divided because different geographic regions could have different unused stations. For example, the carrier frequency 97.5 MHz could be an unused frequency in a first geographic region (e.g. the Los Angeles metropolitan region), but a radio station could be transmitting on this frequency in a second or adjacent geographic region (e.g. the San Diego and/or San Francisco metropolitan region). In some examples, the region can be divided into separate locations or geographical areas as described above in relation to method 700 (FIG. 7).

Method 1400 in FIG. 14 continues with an activity 1461 of receiving default data regarding the signal strength and/or user ratings for the one or more carrier radio frequencies in the one or more geographical areas. In some examples, the default data is data regarding the signal strength for the one or more carrier frequencies is calculated using data from the government regarding radio station signal strength. In other examples, method 1100 does not include activity 1461, and no default data is used. In some examples, the default data can be provided to electrical devices requesting unused frequencies until a list of unused frequencies can be determined as described below.

Next, method 1400 of FIG. 14 includes an activity 1462 of receiving signal strength information and/or user ratings for one or more carrier frequencies in a predetermined geographic area from two or more first electrical devices. In some examples, electrical device 110 (FIG. 1) can include an unused frequency identification module 214 (FIG. 2) that can deteii line unused frequencies at the current location of electrical device 110 or receive a user rating from the user of system 101. Furthermore, electrical device 110 can be configured to automatically transmit this information to server 170 (FIG. 1). In some examples, the signal strength information is a list of unused frequencies at the first location.

After receiving the signal strength information and/or user ratings, method 1400 in FIG. 14 continues with an activity 1463 of storing the signal strength information and/or user ratings. In some examples, server 170 (FIG. 1) stores the information in database 474 of storage component 473.

Next, method 1400 of FIG. 14 includes an activity 1464 of using the default data with the signal strength information and/or user ratings to identify the at least one unused frequency in the predetermined geographic area. In the same or different embodiments, identifying the at least one unused frequency can include analyzing the signal strength information and/or user ratings to identify at least one first unused frequency in the predetermined geographic area.

In some examples, identifier module 472 can analyze the information to determine if one or more carrier frequencies appear to have low signal strength, repeatedly show up on the different electrical devices' lists of unused frequencies, or receive many positive user ratings. In some examples, the default data can also be considered when determining the at least one unused frequency at the predetermined location or geographical area.

Subsequently, method 1400 of FIG. 14 includes an activity 1465 of providing information identifying the at least one first unused frequency to one or more second electrical devices. In some examples, the information can be provided to the one or more electrical devices as described above in relation to activity 752 of FIG. 7.

One of the advantages of this method is that data from one or more first electrical devices can be aggregated to determine unused frequencies at a first geographical region, and these unused frequencies can be provide to one or more different electrical devices. Thus, list of unused frequencies provided to users will be more accurate because the list of unused frequencies is based on multiple measurement of signal strength by different devices and/or multiple user ratings by different users. This activity can be repeated for all the geographical areas at predetermined time intervals or when new information is received.

After providing the information identifying the at least one first unused frequency, method 1400 of FIG. 14 includes an activity 1466 of receiving usage information from the one or more second electrical devices. In one example, the usage information comprises data on the use of the at least one first unused frequency by the one or more second electrical devices. In the same or different example the usage information comprises user rating information about the at least one unused frequency.

Method 1400 in FIG. 14 continues with an activity 1467 of using the usage information with the signal strength information to identify the at least one second unused frequency in the second predetermined geographic area. The at least one second unused frequency can be an updated list of unused frequencies in the second geographic region. This activity can be repeated for all the geographical areas at predetermined time intervals or when new information for that geographical area is received. In some examples, the default data can also be used to calculate the at least one second unused frequency. In other examples, activities 1466 and 1467 are omitted because the user ratings have already been incorporated into the determination of used carrier frequencies.

Method 1400 of FIG. 14 can be repeated at predetermined intervals to create updated lists of unused carrier frequencies. Repeating method 1400 allows the inclusion of data received after the last performance of method 1400 and also allows system 100 to remove old data, if desired. For example, data received more than six months prior to the date on which method 1400 was performed could be removed from the database 474 (FIG. 4).

Referring again to FIG. 1, in the same or different embodiment, system 100 can determine transmission frequencies for a route between two locations. In some examples, a user is traveling between his or her current location and a destination location. The user can enter his or her destination location into system 101 (FIG. 1), and system 101 can determine a route from the first location to the destination location. The route can also include one or more intermediate locations. System 101 can transmit the user's current location and the one or intermediate locations (or in an alternative embodiment, the route) to the server 170.

Server 170 can determine at least one unused frequency at the user's current location and the one or more intermediate points. Server 170 can transmit information identifying the unused frequencies to system 101. System 101 can receive the information identifying the unused frequencies. System 101 can select a transmission frequency for the current location and each of the one or more intermediate locations from the at least one unused frequency. System 101 can communicate the transmission frequency for a location when the first device is at that location.

In still another embodiment, system 101 can store a copy of the list of unused frequencies in a database in the memory of electrical device 110 or electrical device 140. In some examples, the local copy of the list of unused frequencies can be only a subset of the full list of unused frequencies. For example, system 101 can store locally the list of unused frequencies for one or more states, one or more counties, or a portion of a state or county. In some examples, after initially receiving the copy of the list of unused frequencies, system 101 can synchronize its list of useable or unused radio frequencies with the list of useable or unused radio frequencies on a first server.

When system 101 receives a request for a transmission frequency, system 101 can use a global positioning satellite receiver to determine a location of system 101. After determining the location, system 101 can determine at least one first unused frequency at the first location by querying the local database. System 101 can the select a first transmission frequency from at least the at least one first unused frequency and communicate the first transmission frequency to a user.

As the user travels towards the destination location, the user will leave the current location and have into a different location where the previously unused frequency is no longer unused. At this point in time, the GPS system within system 101 can automatically communicate with server 170, and server 170 can automatically identify a new set of unused frequencies and transmit them to system 101, which can display one or more of them to communicate them to the user. This process can repeat until the user reaches the destination location.

Although the invention has been described with reference to specific embodiments, it will be understood by those skilled in the art that various changes may be made without departing from the spirit or scope of the invention. For example, it will be readily apparent that electrical device 110 (FIGS. 1 and 2) could provide the user with a choice of two or more transmission frequencies instead of just providing one transmission frequency to the user. In another example, selection module 213 (FIG. 2) could minimize the amount the user has to change the carrier frequency by providing the unused carrier frequencies closest to the last transmission frequency, instead of providing the highest ranked carrier frequency. In still other examples, GPS receiver 344 (FIG. 3) can be located in electrical device 110, instead of electrical device 140. Additional examples of such changes have been given in the foregoing description.

In some examples, system 100 (FIG. 1) can include a method where a user can share his or her unused frequencies. In one embodiment, server 170 (FIG. 1) can store a user's unused frequencies, and the user can logon to server 170 and share his or her list of unused frequencies. In other examples, system 101 can communicate directly with system 185 (FIG. 1) to share lists of unused frequencies. Accordingly, the disclosure of embodiments of the invention is intended to be illustrative of the scope of the invention and is not intended to be limiting.

It is intended that the scope of the invention shall be limited only to the extent required by the appended claims. To one of ordinary skill in the art, it will be readily apparent that the case and method of use discussed herein may be implemented in a variety of embodiments, and that the foregoing discussion of certain of these embodiments does not necessarily represent a complete description of all possible embodiments. Rather, the detailed description of the drawings, and the drawings themselves, disclose at least one preferred embodiment of the invention, and may disclose alternative embodiments of the invention.

All elements claimed in any particular claim are essential to the invention claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of determining one or more useable radio frequencies in two or more first geographic areas, the two or more first geographic areas comprise a second geographic area and a third geographic area, the method comprising:
   receiving first usability information for one or more radio frequencies in the second geographic area from two or more first electrical devices, the two or more first electrical devices are located in the second geographic area;
   storing the first usability information;
   analyzing the first usability information to identify at least one first unused frequency in the third geographic area; and
   providing information identifying the at least one first unused frequency to one or more second electrical devices, the one or more second electrical devices are located in the third geographic area,
wherein:
   the one or more useable radio frequencies comprise the at least one first unused frequency; and
   the first usability information comprises at least one of signal strength information or user rating information.

2. The method of claim 1, further comprising:
   analyzing the first usability information to identify at least one second unused frequency in a fourth geographic area; and
   providing second information identifying the at least one second unused frequency to one or more third electrical devices, the one or more third electrical devices are located in the fourth geographic area,
wherein:
   the one or more useable radio frequencies further comprise the at least one second unused frequency; and
   the two or more first geographic areas further comprise the fourth geographic area.

3. The method of claim 1, wherein:
   providing the information comprises:
      providing the information identifying the at least one first unused frequency to the one or more second electrical devices at least partially over a cellular telephone network.

4. The method of claim 1, further comprising:
after providing the information identifying the at least one first unused frequency, receiving usage information from at least one of the one or more second electrical devices,
wherein:
the usage information comprises data regarding use of the at least one first unused frequency.

5. The method of claim 4, further comprising:
using the usage information with the first usability information to identify at least one second unused frequency in the third geographic area; and
providing information identifying the at least one second unused frequency to one or more third electrical devices, the one or more third electrical devices are located in the third geographic area,
wherein:
the one or more useable radio frequencies further comprise the at least one second unused frequency.

6. The method of claim 1, further comprising:
receiving default data regarding the signal strength information for the one or more radio frequencies in the second geographic area,
wherein:
analyzing the first usability information comprises:
using the default data in combination with the first usability information to identify the at least one first unused frequency in the third geographic area; and
the default data comprises data regarding the signal strength information for the one or more radio frequencies in the two or more first geographic areas that are calculated using data from a government regarding radio station signal strength.

7. The method of claim 1, further comprising:
after providing the information identifying the at least one first unused frequency, receiving second user rating information from at least one of the one or more second electrical devices; and
using the second user rating information with the first usability information to identify at least one second unused frequency in the third geographic area,
wherein:
the one or more useable radio frequencies further comprise the at least one second unused frequency.

8. The method of claim 1, wherein:
the second and third geographic areas comprise a geographical region with a single postal code.

9. The method of claim 1, wherein:
the second and third geographical areas comprise a geographical region within a circle;
and
the circle is centered at a predetermined point on Earth's surface and has a predetermined radius.

10. The method of claim 9, wherein:
the predetermined point on the Earth's surface is a first set of global positioning satellite coordinates of at least one of the one or more second electrical devices.

11. The method of claim 1, wherein:
receiving the first usability information comprises:
receiving second usability information at a first set of global positioning satellite coordinates from a first device of the two or more first electrical devices;
receiving third usability information at a second set of global positioning satellite coordinates from a second device of the two or more first electrical devices;
the second geographic area comprises the first set of global positioning satellite coordinates and the second set of global positioning satellite coordinates; and
the first usability information comprises the second usability information and the third usability information.

12. The method of claim 11, wherein:
storing the first usability information comprises:
storing the second usability information with the first set of global positioning satellite coordinates; and
storing the third usability information with the second set of global positioning satellite coordinates.

13. The method of claim 1, wherein:
the third geographic area comprises a first set of global positioning satellite coordinates;
analyzing the first usability information comprises:
analyzing the first usability information to identify one or more first recommended frequencies in a circle with a predetermined radius, the first set of global positioning satellite coordinates located within the circle; and
the one or more first recommended frequencies comprises the at least one first unused frequency.

14. A method of transmitting electrical signals, the method comprising:
using a global positioning satellite receiver to determine a first location of a first electrical device;
synchronizing a first list of useable radio frequencies with a second list of useable radio frequencies in a database from a first server to create a third list of useable radio frequencies;
determining at least one first unused frequency at the first location by querying the third list of the useable radio frequencies;
selecting a first transmission frequency from the at least one first unused frequency; and
communicating the first transmission frequency to a user.

15. The method of claim 14, wherein:
the first list of the useable radio frequencies is stored at the first electrical device.

16. The method of claim 14, further comprising:
receiving first usability information for one or more radio frequencies in a first geographic area from two or more second electrical devices, the two or more second electrical devices are located in the first geographic area;
storing the first usability information;
analyzing the first usability information to identify the second list of the useable radio frequencies; and
providing the second list of the useable radio frequencies to the first electrical device.

17. The method of claim 14, further comprising:
receiving the first location of the first electrical device at the first server;
determining the second list of the useable radio frequencies by querying the database; and
communicating the second list of the useable radio frequencies to the first electrical device.

18. An electrical device comprising:
a global positioning satellite receiver configured to determine a location of the electrical device;
a receiver configured to receive first information regarding at least one unused FM radio frequency;
a first transmitter configured to transmit second information regarding the location of the electrical device to a first server;
a selection module electrically coupled to the receiver and the first transmitter; and a display configured to display third information regarding a first FM radio transmission frequency to a user of the electrical device, wherein:

the receiver is configured to receive the first information regarding the at least one unused FM radio frequency from the first server in response to the first transmitter transmitting the second information regarding the location of the electrical device to the first server;

the first server is not part of the electrical device; and the selection module is configured to select the first FM radio transmission frequency from the at least one unused FM radio frequency.

19. The electrical device of claim 18, further comprising:

a second transmitter electrically configured to transmit data over the first FM radio transmission frequency, wherein:

the selection module is configured to automatically tune the second transmitter to the first FM radio transmission frequency.

20. The electrical device of claim 18, wherein:

the receiver is configured to receive the first information from the first server over at least one of a cellular phone network or a computer network; and the first transmitter is configured to transmit the second information to the first server over at least one of the cellular phone network or the computer network.

* * * * *